United States Patent
Yamada et al.

(10) Patent No.: US 10,559,721 B2
(45) Date of Patent: Feb. 11, 2020

(54) LIGHT EMITTING DEVICE

(71) Applicant: NICHIA CORPORATION, Anan-shi, Tokushima (JP)

(72) Inventors: Motokazu Yamada, Tokushima (JP); Mototaka Inobe, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/784,781

(22) Filed: Oct. 16, 2017

(65) Prior Publication Data

US 2018/0040776 A1 Feb. 8, 2018

Related U.S. Application Data

(60) Continuation of application No. 14/610,030, filed on Jan. 30, 2015, now Pat. No. 9,806,234, which is a (Continued)

(30) Foreign Application Priority Data

Dec. 28, 2007 (JP) ................................. 2007-339127
Feb. 1, 2008 (JP) ................................. 2008-022815

(51) Int. Cl.
*H01L 33/46* (2010.01)
*H01L 33/62* (2010.01)
(Continued)

(52) U.S. Cl.
CPC ............ *H01L 33/46* (2013.01); *H01L 33/486* (2013.01); *H01L 33/56* (2013.01); *H01L 33/60* (2013.01);
(Continued)

(58) Field of Classification Search
None
See application file for complete search history.

(56) References Cited

U.S. PATENT DOCUMENTS 5,748,658 A 5/1998 Nakanishi et al.
5,962,810 A 10/1999 Glenn
(Continued)

FOREIGN PATENT DOCUMENTS

JP 05-029665 A 2/1993
JP 11-289110 A 10/1999
(Continued)

OTHER PUBLICATIONS

Office Action of the corresponding Japanese Application No. 2007-339127, dated May 29, 2012.

*Primary Examiner* — Abul Kalam
(74) *Attorney, Agent, or Firm* — Global IP Counselors, LLP

(57) ABSTRACT

A light emitting device includes a substrate, a light emitting element, a light reflecting resin member, a sealing member, an electrically conductive wiring and a lens member. The light reflecting resin member surrounds the light emitting element. The sealing member is disposed in a region surrounded by the light reflecting resin member. The electrically conductive wiring is arranged on an upper surface of the substrate such that the substrate includes an exposed region exposed from the electrically conductive wiring with at least a part of the exposed region of the substrate being embedded in the light reflecting resin member. The lens member is disposed above the light emitting element to reach an outer edge of the substrate. The lens member is in contact with an upper surface of the sealing member and an upper surface and an outer lateral surface of the light reflecting resin member.

16 Claims, 15 Drawing Sheets

Related U.S. Application Data continuation of application No. 13/242,641, filed on Sep. 23, 2011, now Pat. No. 9,024,343, which is a division of application No. 12/341,189, filed on Dec. 22, 2008, now Pat. No. 8,049,237.

(51) Int. Cl.
  *H01L 33/60* (2010.01)
  *H01L 33/48* (2010.01)
  *H01L 33/56* (2010.01)
  H01L 25/075 (2006.01)
  H01L 25/16 (2006.01)

(52) U.S. Cl.
  CPC .......... *H01L 33/62* (2013.01); *H01L 25/0753* (2013.01); *H01L 25/167* (2013.01); *H01L 2224/45144* (2013.01); *H01L 2224/48137* (2013.01); *H01L 2224/48465* (2013.01); *H01L 2224/4945* (2013.01); *H01L 2924/01322* (2013.01); *H01L 2933/005* (2013.01); *H01L 2933/0025* (2013.01); *H01L 2933/0033* (2013.01); *H01L 2933/0066* (2013.01)

(56) References Cited

U.S. PATENT DOCUMENTS

| | | |
|---|---|---|
| 7,101,061 B2 | 9/2006 | Nagai et al. |
| 7,365,371 B2 | 4/2008 | Andrews |
| 2002/0176251 A1 | 11/2002 | Plank et al. |
| 2002/0187570 A1 | 12/2002 | Fukasawa et al. |
| 2003/0038295 A1 | 2/2003 | Koda |
| 2004/0041165 A1 | 3/2004 | Fukasawa et al. |
| 2004/0089898 A1 | 5/2004 | Ruhnau et al. |
| 2004/0170019 A1 | 9/2004 | Tamai |
| 2004/0179359 A1 | 9/2004 | Miyawaki et al. |
| 2004/0179373 A1 | 9/2004 | Tamai et al. |
| 2005/0093005 A1 | 5/2005 | Ruhnau et al. |
| 2005/0218531 A1 | 10/2005 | Ruhnau et al. |
| 2005/0248008 A1 | 11/2005 | Wilson |
| 2006/0007553 A1* | 1/2006 | Bogner ............. G02F 1/133603 359/630 |
| 2006/0181877 A1 | 8/2006 | Sidwell |
| 2007/0170454 A1* | 7/2007 | Andrews ................. H01L 33/52 257/100 |
| 2008/0007939 A1 | 1/2008 | Lee et al. |
| 2008/0054287 A1* | 3/2008 | Oshio ..................... H01L 33/60 257/99 |
| 2009/0026482 A1 | 1/2009 | Ruhnau et al. |
| 2009/0095972 A1 | 4/2009 | Yasuda |
| 2009/0154195 A1 | 6/2009 | Ishii et al. |
| 2010/0078664 A1 | 4/2010 | Helbing |
| 2010/0084683 A1 | 4/2010 | Lai et al. |
| 2010/0327307 A1 | 12/2010 | Ruhnau et al. |
| 2011/0180822 A1 | 7/2011 | Ruhnau et al. |

FOREIGN PATENT DOCUMENTS

| | | |
|---|---|---|
| JP | 2002-368281 A | 12/2002 |
| JP | 2003-142737 A | 5/2003 |
| JP | 2004-040099 A | 2/2004 |
| JP | 2004-055632 A | 2/2004 |
| JP | 2004-265979 A | 9/2004 |
| JP | 2005-012240 A | 1/2005 |
| JP | 2005-136379 A | 5/2005 |
| JP | 2005-347467 A | 12/2005 |
| JP | 2006-066786 A | 3/2006 |
| JP | 2006-324589 A | 11/2006 |
| JP | 2007-080990 A | 3/2007 |
| JP | 2007-149908 A | 6/2007 |
| JP | 2007-149909 A | 6/2007 |
| JP | 2007-227882 A | 9/2007 |
| JP | 2008-021650 A | 1/2008 |
| JP | 2008-041290 A | 2/2008 |
| JP | 2009-135485 A | 6/2009 |
| WO | 2007-037339 A1 | 4/2007 |

* cited by examiner

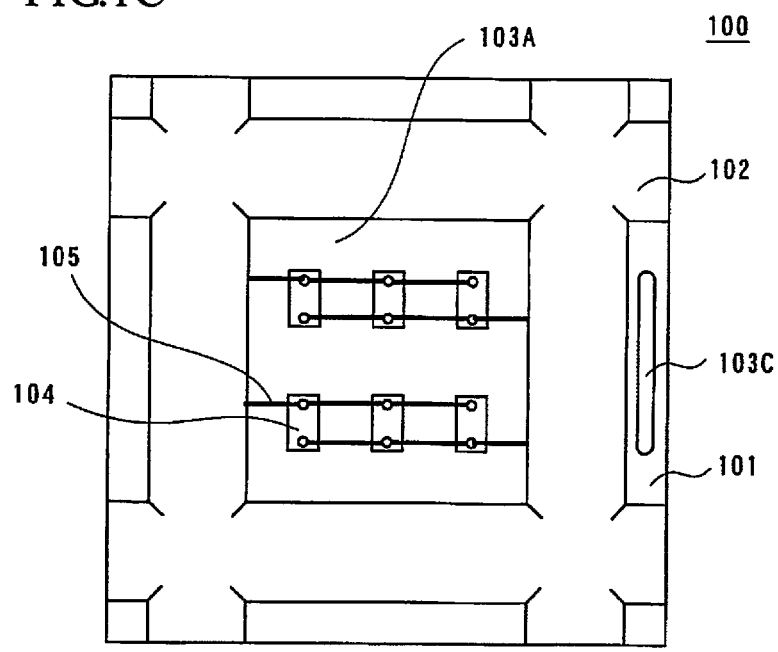

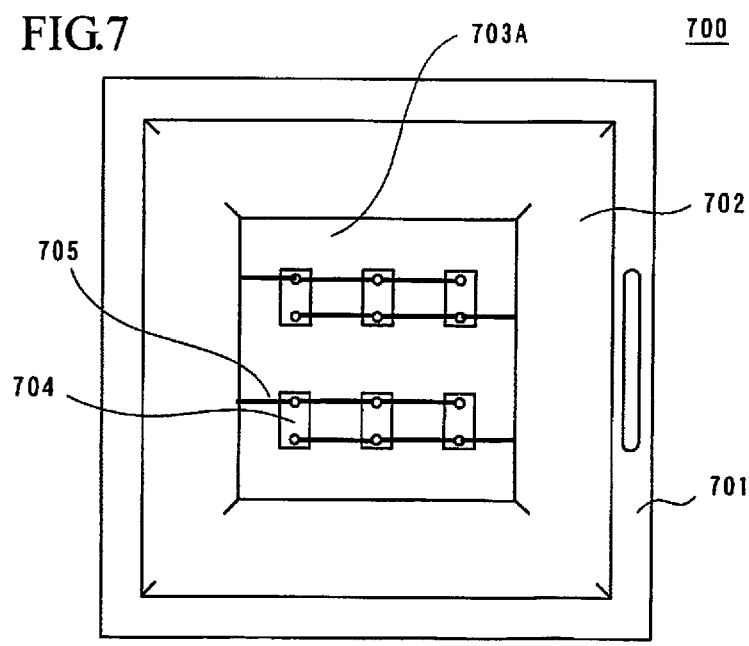
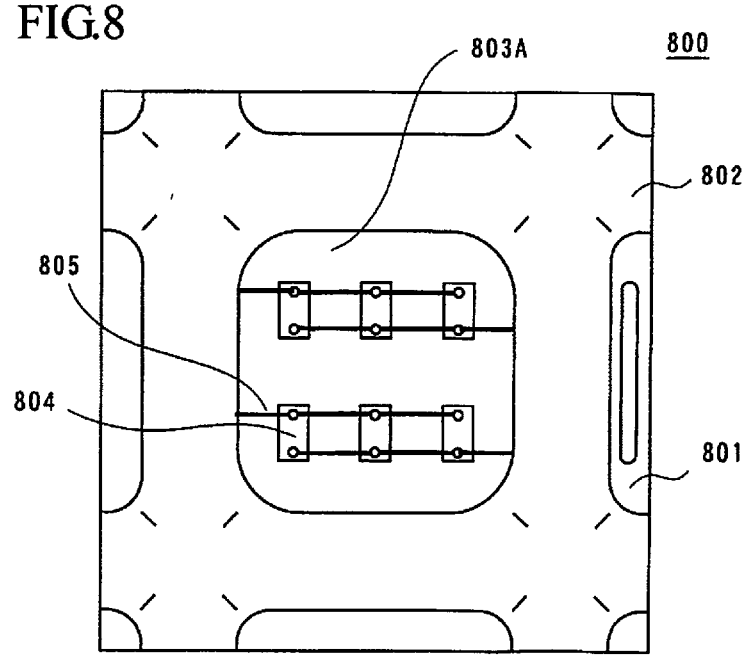

LIGHT EMITTING DEVICE

CROSS-REFERENCE TO RELATED APPLICATIONS

This application is a continuation application of U.S. patent application Ser. No. 14/610,030 filed on Jan. 30, 2015, which is a continuation application of U.S. patent application Ser. No. 13/242,641 filed on Sep. 23, 2011, now U.S. Pat. No. 9,024,343, which is a divisional application of U.S. patent application Ser. No. 12/341,189 filed on Dec. 22, 2008, now U.S. Pat. No. 8,049,237. This application claims priority to Japanese Application No. 2007-339127 filed in Japan on Dec. 28, 2007, and Japanese Application No. 2008-22815 filed in Japan on Feb. 1, 2008. The entire disclosures of U.S. patent application Ser. Nos. 14/610,030, 13/242,641 and 12/341,189, and Japanese Application Nos. 2007-339127 and 2008-22815 are incorporated hereinto by reference.

BACKGROUND OF THE INVENTION

1. Field of the Invention

The present invention relates to a light emitting device that can be used in an indicator, a lighting apparatus, a display, a backlight for liquid crystal display etc., and more particularly to a light emitting device excellent in light extraction efficiency in which high reliability can be obtained even when a semiconductor light emitting device having high output is mounted.

2. Background Information

In recent years, various light emitting devices using semiconductor light emitting element (hereinafter, may be referred to as light emitting element) have been developed, and methods to improve output have been explored.

For example, JP2004-265979A describes provision of reflector as close as possible to the light emitting element between a light emitting element and a wiring land provided on a substrate to obtain a high luminance.

However, in a case where such a reflector is provided, in order to prevent a light emitting element and a conductive wire from being damaged, a certain distance is required between such electronic components and the reflector. Thus, downsizing is difficult and the size of the light emitting device is limited. Further, the light emitting element and the reflector are set apart that may cause a reduction of the light extracting efficiency. Particularly, in a case where a gold wire is used to electrically connect a light emitting element to each terminal, gold absorbs light from the light emitting element and a longer wire is required when the reflector is provided as described above. Thus, the absorption of light increases and the output of light decreases.

In addition, a light emitting diode which is a light emitting element is dipolar element. Therefore, an insulating portion is needed between the positive and negative wiring lands (conductor wiring) provided on the substrate. Typically, the insulating portion can be easily provided by exposing an insulating substrate material of the substrate, or the like. However, various limitations are set on an insulating substrate material so as to produce packages efficiently or to secure mechanical strength, or the like, therefore, on properties such as optical properties (optical reflectivity and optical absorptance), a material having a desired properties has not always been used.

SUMMARY OF THE INVENTION

A light emitting device according to one aspect includes a substrate, a light emitting element, a light reflecting resin member, a sealing member, an electrically conductive wiring and a lens member. The light emitting element is mounted on the substrate. The light reflecting resin member surrounds the light emitting element, and configured and arranged to reflect light emitted from the light emitting element. The sealing member is disposed in a region surrounded by the light reflecting resin member. The electrically conductive wiring is arranged on an upper surface of the substrate such that the substrate includes an exposed region exposed from the electrically conductive wiring with at least a part of the exposed region of the substrate being embedded in the light reflecting resin member. The electrically conductive wiring is electrically connected to the light emitting element. The lens member is disposed above the light emitting element to reach an outer edge of the substrate. The lens member is in contact with an upper surface of the sealing member and an upper surface and an outer lateral surface of the light reflecting resin member.

A light emitting device according to another aspect includes a substrate, a light emitting element, a light reflecting resin member, a sealing member, an electrically conductive wiring and a protective element. The light emitting element is mounted on the substrate. The light reflecting resin member surrounds the light emitting element, and configured and arranged to reflect light emitted from the light emitting element The sealing member is disposed in a region surrounded by the light reflecting resin member. The electrically conductive wiring is arranged on an upper surface of the substrate, and electrically connected to the light emitting element. The protective element is arranged on the electrically conductive wiring such that at least a part of the protective element is embedded in the light reflecting resin member. The lens member is disposed above the light emitting element to reach an outer edge of the substrate. The lens member is in contact with an upper surface of the sealing member and an upper surface and an outer lateral surface of the light reflecting resin member.

BRIEF DESCRIPTION OF THE DRAWINGS

FIG. 1C is a top view of a light emitting device of FIG. 1A.

FIG. 7 is a top view illustrating an example of a light emitting device according to the present invention.

FIG. 8 is a top view illustrating an example of a light emitting device according to the present invention.

DETAILED DESCRIPTION OF THE PREFERRED EMBODIMENTS

Figure 1A:
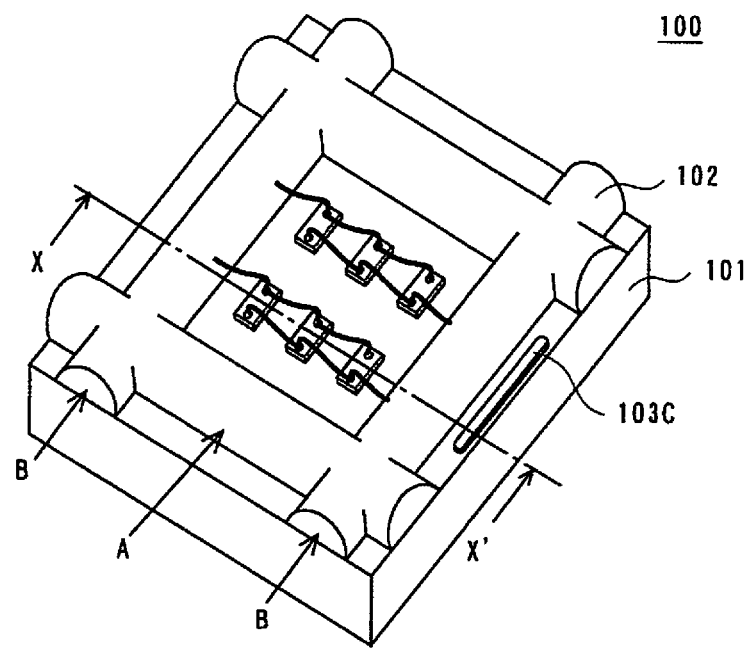
FIG. 1A is a perspective view illustrating an example of a light emitting device according to the present invention.

The preferred embodiments of the present invention will be described below with reference to the accompanying drawings. Herein, the form of the following embodiments are intended as examples of a light emitting device that are representative of the technology behind the present invention, and any limitation of the scope of the invention by the embodiments is not intended.

In addition, the present specification will by no means limit the members described in claims to the members described in the embodiments. Especially, size, material, shape, and the relative configuration etc. of the components described in the preferred embodiments are for illustration, and do not intend to limit the invention therein, unless specifically described. In the drawings, the size and the positional relationship of the components may be exaggerated for clarity. Further, in the description below, identical members or members of the same quality are assigned the same names and reference numerals and detailed description thereof will be arbitrarily omitted. In each constituting component of the present invention, multiple components may be constructed using the same member so that one member can serve as multiple components, or vice versa, a function of a member may be shared by multiple members.

Figure 1B:
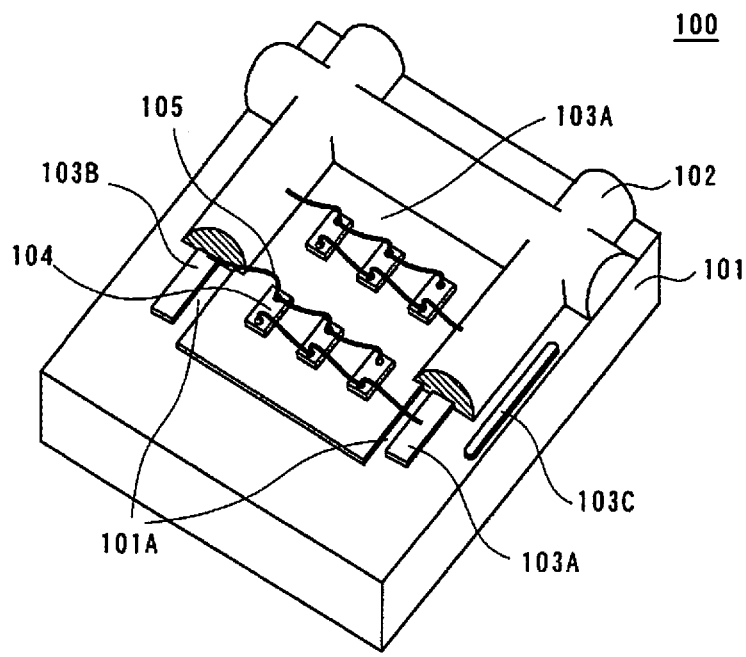
FIG. 1B is a partially sectional perspective view of a section taken along line X-X' of FIG. 1A of a light emitting device.

FIG. 1A is a perspective view showing a light emitting device 100 of the present embodiment, FIG. 1B is a partially sectional perspective view of a section taken along line X-X' of FIG. 1A, and FIG. 1C shows a top view of FIG. 1A. In the present embodiment, a light emitting device 100 includes an approximately rectangular substrate 101 having conductor wiring 103A, 103B, and 103C provided on its top surface, and a plurality of light emitting elements 104 mounted on the conductor wiring 103A. A surrounding of these light emitting elements 104 is provided with a light reflecting resin 102 which reflects light from the light emitting elements, and electrically conductive wires 105 which electrically connect the conductor wiring 103A, 103B and the light emitting elements 104. The conductive wiring 103C is made of the same material as the conductive wirings 103A, 103B each of which serves as an electrode, but the conductive wiring 103C is provided as a mark (cathode mark/anode mark) for indicating the polarity of the light emitting device and is not for electrical connection.

According to the present invention, at least a part of the electrically conductive wires 105 is buried in a light reflecting resin. With this arrangement, exposed area of the electrically conductive wires can be minimized so that the absorption of light can be reduced, and thus, optical output can be improved.

Light Reflecting Resin

In the present embodiment, the light reflecting resin 102 is to reflect light from the light emitting elements 104 and provided to surround the light emitting elements and also to bury at least a part of the electrically conductive wires 105. With this arrangement, absorption of light by the electrically conductive wires can be reduced and light can be extracted efficiently.

The electrically conductive wires are such that, as shown in FIG. 1B, one of the electrically conductive wires connected from the light emitting elements 104 is connected to the conductor wiring 103A and the other is connected to the conductor wiring 103B. The conductor wiring 103A is formed such that the region where the light emitting elements to be mounted and the region continuous with the electrically conductive wires are connected at a portion buried in the light reflecting resin 102 (not shown). Then, each part of the electrically conductive wires 105 connected to the conductor wirings 103A, 103B are buried in the light reflecting resin 102. Such structure can be obtained by disposing the light reflecting resin 102 after connecting the electrically conductive wires 105 to the conductor wiring 103A, 103B, respectively.

Here, the light reflecting resin 102 is provided to cover the connecting portion between the electrically conductive wires 105 and the conductor wirings 103A, 103B, but the provision is not limited thereto, for example, the light reflecting resin 102 may be provided between the connecting portion and the light emitting elements to bury the electrically conductive wires being in the regions other than the connecting portion.

Also, there is no need to bury all the electrically conductive wires being used, and for example as shown in FIG. 1A, among a plurality of the electrically conductive wires, only the electrically conductive wires directly connected to the conductor wiring may be buried.

Also, in the present embodiment, at least a part of the substrate exposed from the conductor wiring, that is, the substrate which is exposed without provided with a conductor wiring (hereinafter referred to as an "exposed region"), is buried in the light reflecting resin.

For example as shown in FIG. 1B, light transmitted and/or absorbed at the substrate 101 can be reduced by using the light reflecting resin 102 burying the exposed region 101A of the substrate exposed, such as between the conductor wiring 103A whereon the light emitting elements are mounted and the conductor wiring 103B to which the electrically conductive wires are connected. Typically an insulating member such as ceramic is used for the material of the substrate in view of mechanical strength and workability, but with this, light from the light emitting element may be transmitted through a portion where a conductor wiring is not provided. The substrate side is not intended to emit light, that is, a direction different than an upward direction such as shown in FIG. 1A. Therefore, it is undesirable if light transmits in such a direction because it causes a loss in the amount of light in a desired direction and results in reduction of light extraction efficiency.

According to the present invention, a material having at least a lower optical transmittance than that of the substrate and a higher reflectivity on the light from the light emitting elements is selected for the light reflecting resin, and an exposed region of the substrate is buried (covered) with the light reflecting resin. Thus, a loss of light due to transmittance of light in an undesired direction can be reduced. Also, in a case where a substrate capable of absorbing light such as a ceramic of darker color is used, absorption of light by the substrate can be reduced by covering, that is, by burying the exposed region of the substrate with a light reflecting resin. As a result, light extracting efficiency can be improved.

In a case where the exposed region as described above is buried with a light reflecting resin, such an advantageous effect can also be obtained when the light emitting elements are connected with the conductor wirings without using the conductive wires. For example, in a case where the light emitting elements are made of a nitride-based semiconductor using a sapphire substrate, the electrodes are disposed on the same surface side, so that, as shown in FIG. 1A, at least two electrically conductive wires are needed to each of the light emitting elements. However, if the electrodes are arranged down and connected to the conductor wiring by using a metallic bonding member or the like, the electric connection can be obtained without using the electrically conductive wires. In such a case, the exposed region of the substrate, that is, an insulating portion is formed directly beneath the light emitting elements, so that a light reflecting resin can also be applied on the exposed region.

In addition, as shown in FIG. 1A, in a case where an electrically conductive wire is used, at least a part of the electrically conductive wire and at least a part of the exposed region of the substrate are preferably buried. Particularly, if the same resin is used to bury them, an advantageous effect such as simplifying the manufacturing steps can be obtained. The light reflecting resin can also be provided in different steps.

Moreover, a protective element and an integrated circuit may be buried with the light reflecting resin. With this arrangement, scattering and absorbing of light can be reduced, and also it eliminates the need for separately providing the mounting portions of such members, so that the light emitting device can be downsized. A light emitting device using a protective element will be described with reference to FIG. 3.

Figure 3:
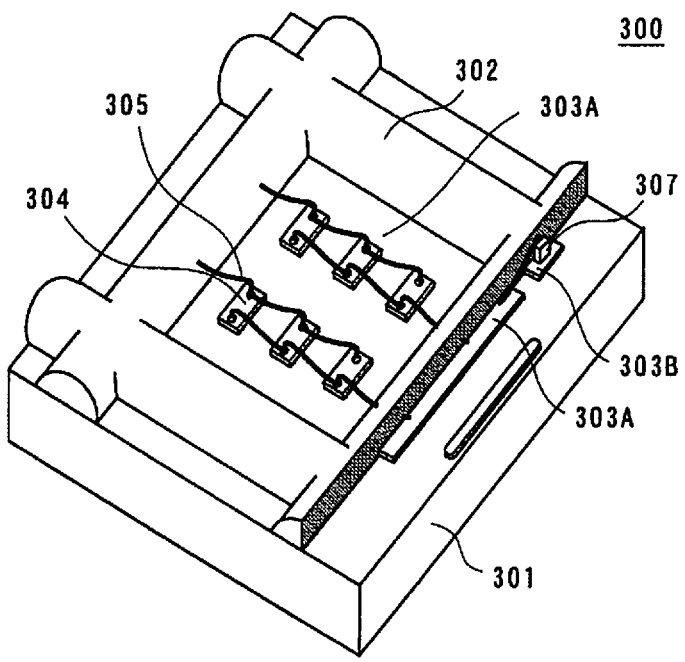
FIG. 3 is a partially sectional perspective view illustrating an example of a light emitting device according to the present invention.

FIG. 3 is a partially sectional view of the light emitting device 300 using a protective element. The external view of the light emitting device 300 is similar to that shown in FIG. 1A, and the shape of the light reflecting resin 302 is similar to that of the light emitting device 100 shown in FIG. 0.1A, and a sectional view of a part thereof is shown for observation. As shown in FIG. 3, the conductor wirings 303A, 303B are provided on the substrate 301 in the light emitting device 300. The light emitting elements 304 are mounted on the conductor wiring 303A and connected with the conductor wirings 303A and 303B through the electrically conductive wires 305. The protective element 307 is mounted on the conductor wiring 303B and fixed thereto by an electrically conductive bonding member, and also connected to the conductor wiring 303A through the electrically conductive wire. Then, the light reflecting resin 302 is disposed so as to bury the protective element 307.

Here, the protective element 307 is provided so that the whole thereof is buried in the light reflecting resin 302. With this arrangement, absorption of light from the light emitting element 304 can be prevented. It may be applicable that not a whole but at least a part of the protective element may be covered. In addition, it is preferable that the electrically conductive wires connecting the protective element and the conductor wiring are also buried in the light reflecting resin.

The light reflecting resin in which the protective element to be buried is preferably provided to also bury at least a part of the electrically conductive wires connecting the light emitting elements and the conductor wiring. In addition, it is preferable that at least a part of the exposed region of the substrate is also buried. Further, the light reflecting resin is preferably provided to bury at least a part of the electrically conductive wires, at least a part of the exposed resin of the substrate, and at least a part of the protective element.

As described above, a member (an electrically conductive wire, a protective element, and/or a substrate) which absorbs light from the light emitting elements and a member (a (light transmissive) substrate) transmitting light in an unintended direction are buried in the light reflecting member, and thus, a reduction in the light extraction efficiency can be suppressed.

The light reflecting member as described above is needed to be provided in the region irradiated with the light from the light emitting elements, and arranged to surround the light emitting elements. The height of the light reflecting resin will be described with reference to FIGS. 4.

Figure 4A:
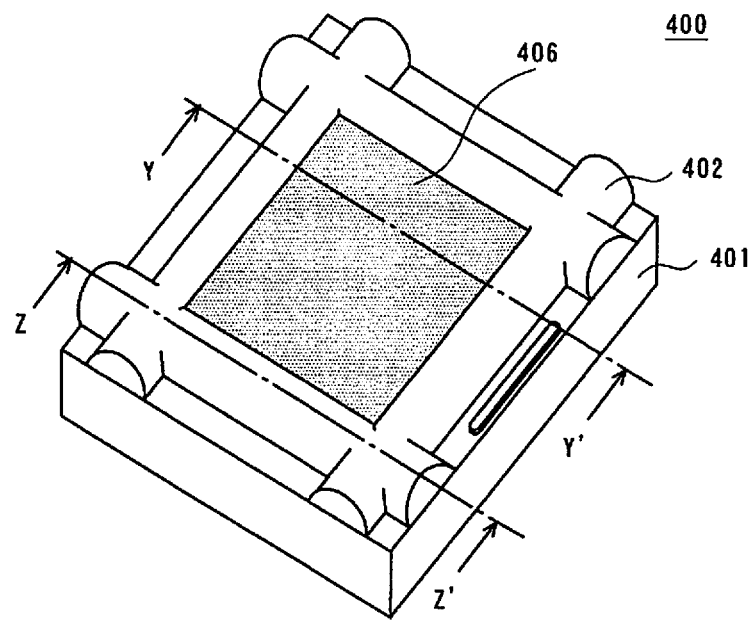
FIG. 4A is a perspective view illustrating an example of a light emitting device according to the present invention.
Figure 4B:
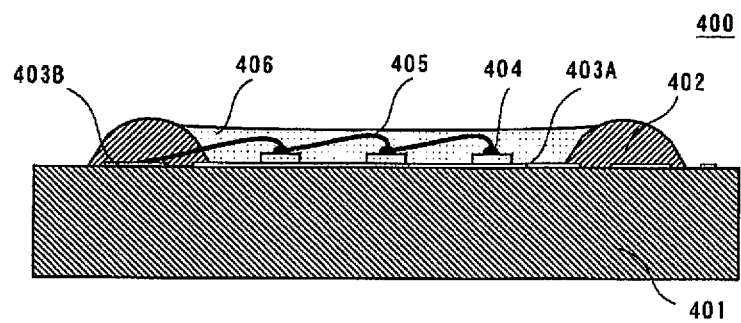
FIG. 4B is a sectional view of a section taken along line Y-Y' of FIG. 4A of a light emitting device.
Figure 4C:
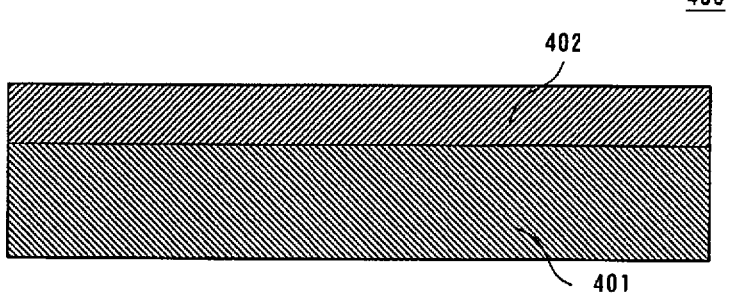
FIG. 4C is a sectional view of a section taken along line Z-Z' of FIG. 4A of a light emitting device.

FIG. 4A is a perspective view of the light emitting device 400 having a sealing member 406. FIG. 4B is a sectional view of a section taken along line Y-Y' of FIG. 4A of a light emitting device. FIG. 4C is a sectional view of a section taken along line Z-Z' of FIG. 4A of a light emitting device. In the present embodiment, the light emitting device 400 shown in FIG. 4A has an arrangement of the light emitting elements and the electrically conductive wire and the like which are similar to that of the light emitting device 100 shown in FIG. 1A and which are buried in the sealing member 406.

As shown in FIG. 4A, FIG. 4B, the light emitting device 400 has the conductor wirings 403A, 403B on the substrate 401. The light emitting elements 404 are mounted on the conductor wiring 403A and are connected with the conductor wiring 403B through the electrically conductive wire 405 (the light emitting elements 404 are also connected to the conductor wiring 403A, but are not shown in the sectional view). Then, the light reflecting resin 402 is disposed surrounding the light emitting elements 404, and the region surrounded by the light reflecting resin 402 is filled with the sealing member 406.

It is preferable that the height of the light reflecting resin is at least the same as the light emitting layer of the light emitting elements or higher. In a case where the electrically conductive wire is used, as shown in FIG. 4B, the light reflecting resin is preferably disposed higher than the highest portion of the electrically conductive wire 405.

When the sealing member 406 is filled in the region surrounding by the light reflecting resin 402, the height of the light reflecting resin is adjusted so that the highest portion of the electrically conductive wires 405 is covered by the sealing member 406. Particularly, in a case where, as the sealing member 406, a liquid resin is disposed by dripping or the like, the height of the light reflecting resin 402 is preferably such that the liquid resin is prevented from flowing out over the light reflecting resin surrounding the light emitting elements. In a case where the sealing member is provided by compression molding or print coating, a sealing member may be disposed outside of the light reflecting resin surrounding the light emitting elements.

In addition, as shown in the sectional view of FIG. 4C, the light reflecting resin 402 is preferably disposed at a predetermined height (a height approximately in parallel with the main surface of the substrate) with respect to the main surface (upper surface, lower surface) of the substrate 401. The shape of the light reflecting resin is not limited thereto and another shape may be employed according to the method of disposing the light reflecting resin.

Figure 5:
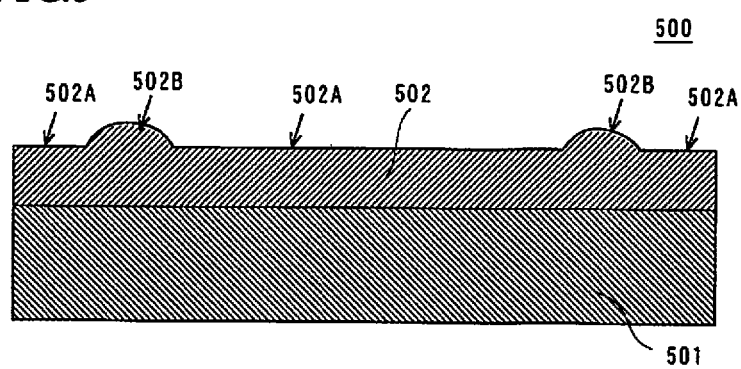
FIG. 5 is a perspective view illustrating another example of a light emitting device taken along line Z-Z' of FIG. 4A.

For example, the light emitting device 500 shown in FIG. 5 is a sectional view of a part of the light reflecting resin corresponding to the sectional view taken along line Z-Z' of FIG. 4A, and has a light reflecting resin 502 having a shape in which a part of the light reflecting resin bulges out, which is different than the light reflecting resin 402 having a flat surface as shown in FIG. 4C. Specifically, a part of the light reflecting resin 402 of the light emitting device 400 shown in FIG. 4A, which is a part of the light reflecting resin 502B corresponding to the position where the longitudinal light reflecting resin and the lateral light reflecting resin intersect is formed somewhat higher than the rest of the light reflecting resin 502A.

Such a shape of the light reflecting resin having a bulging part can be formed by discharging a resin of high viscosity from a nozzle in longitudinal direction and lateral direction onto the substrate prior to dividing. Particularly, in a case where the light emitting element has a protective element 307 as shown in FIG. 3, by disposing the protective element in a region where the light reflecting resin to be disposed higher than other regions, the entire protective element that is relatively tall can be buried in the light reflecting resin.

It is preferable that the surfaces (inner wall) of the light reflecting member facing the light emitting elements are formed inclined widening upward as shown in the partially sectional view of FIG. 4B, for example. In FIG. 1B, both the inner walls and the outer walls are made as inclined surfaces, but either only one of them (for example, the inner walls) may be made inclined. In addition, in FIG. 1B, a part between the inner wall and the outer wall is rounded, but the shape is not limited thereto and other shape may be employed such as a shape having a flat top.

Moreover, the distance between the inner shape and the outer shape of the light reflecting resin, that is, the width of the light reflecting resin in top view can be adjusted according to various factors such as the size of the substrate, the size of the light emitting element to be mounted. In addition, the distance is preferably selected also in view of balance with the height.

The inner shape of the light reflecting resin disposed surrounding the light emitting elements will be described referring to FIG. 1C, FIG. 8 etc. FIG. 1C, FIG. 8 are top view of the light emitting devices 100, 800, in which the conductor wirings 103A, 803A are disposed on the approximately rectangular substrates 101, 801 and the light emitting elements 1040, 804 are mounted thereon, respectively. The light emitting elements and the conductor wirings are connected by the electrically conductive wires 105, 805. The electrically conductive wires in the vicinity of the connect portion are buried in the light reflecting resin 102, 802, respectively, and therefore not shown in the figures. The inner shape of the light reflecting resin disposed surrounding the light emitting elements may be formed approximately rectangular in top view, as shown in FIG. 1C. The shape thereof is not limited thereto, and as shown in FIG. 8, an approximately rectangular shape with rounded corners may be employed. Particularly, in a case where a high viscosity resin is applied as the light reflecting resin, a shape with rounded corners as shown in FIG. 8 can be obtained by providing the light reflecting resin in longitudinal direction and lateral direction intersecting each other before hardening so that they mix and merge. Such a shape facilitates light to be reflected evenly. The shape is not limited to that described above and, an appropriate shape such as a circle, an oval, or a polygon in plan view may be employed according to desired emission properties or the like.

Further, in the present invention, the light reflecting resin may be disposed to reach a side surface of the light emitting elements. In this case, the inner shape corresponds to the shape of the light emitting elements and the arrangement thereof.

In addition, in the light emitting device shown in such as FIG. 1C has a light reflecting resin disposed to surround a plurality of the light emitting elements, but the arrangement is not limited thereto, the light reflecting resin may be disposed top surround a single light emitting element, or to surround two or more light emitting elements. As described above, when the light reflecting resin is closely arranged and the electrically conductive wires which absorbs light or the substrate which transmits/absorbs light is buried therein, loss of light can be reduced efficiently.

The outer shape of the light reflecting resin disposed surrounding the light emitting elements will be described referring to FIG. 1C, FIG. 7 etc. FIG. 1C, FIG. 7 are top view of the light emitting devices 100, 700, in which the conductor wirings 103A, 703A are disposed on the approximately rectangular substrates 101, 701 and the light emitting elements 104, 704 are mounted thereon, respectively. The light emitting elements and the conductor wirings are connected by the electrically conductive wires 105, 705. The electrically conductive wires in the vicinity of the connect portion are buried in the light reflecting resin 102, 702, respectively, and therefore not shown in the figures. The outer shape of the light reflecting resin arranged surrounding the light emitting elements may be such that, as shown in FIG. 7 in top view, the outer edge of the light reflecting resin 702 is placed apart from the outer edge of the substrate 701. In this case, the outer edge of the substrate and the outer edge of the light reflecting resin are preferably made in the same shape but different size. In a case where the substrate 701 is approximately square as shown in FIG. 7, it is preferable that the outer edge of the light reflecting resin 702 is also made in approximately square shape with respective sides being approximately in parallel.

As described above, when the outer edge of the substrate and the outer edge of the light reflecting resin are spaced apart from each other, in other words, when the outer edge of the light reflecting resin is made smaller than the outer edge of the substrate, dividing step in a post-process can be facilitated. Particularly, in a case where a resin having different hardness or the like than that of the substrate is used as the light reflecting resin, for example, in a case where a light reflecting resin having lower hardness and higher ductility than a ceramic substrate is disposed on the ceramic substrate, the later dividing step (step to form single chips) may be difficult to perform (difficult to divide). Therefore, the outer edge (that is, the dividing position) of the substrate only includes the substrate, dividing can be performed with a good process yield.

Figure 9A:
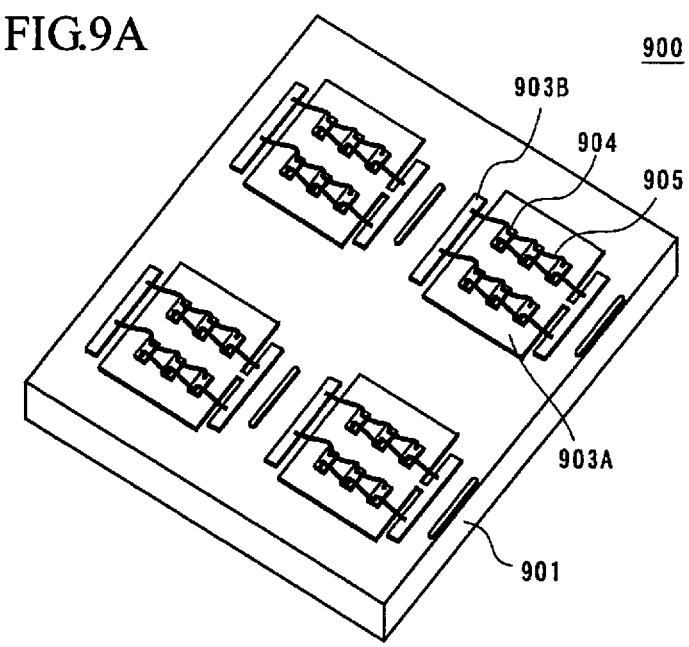
FIG. 9A is a view showing a part of light emitting device aggregation prior to dividing the substrate, illustrating a state before disposing a light reflecting resin.
Figure 9B:
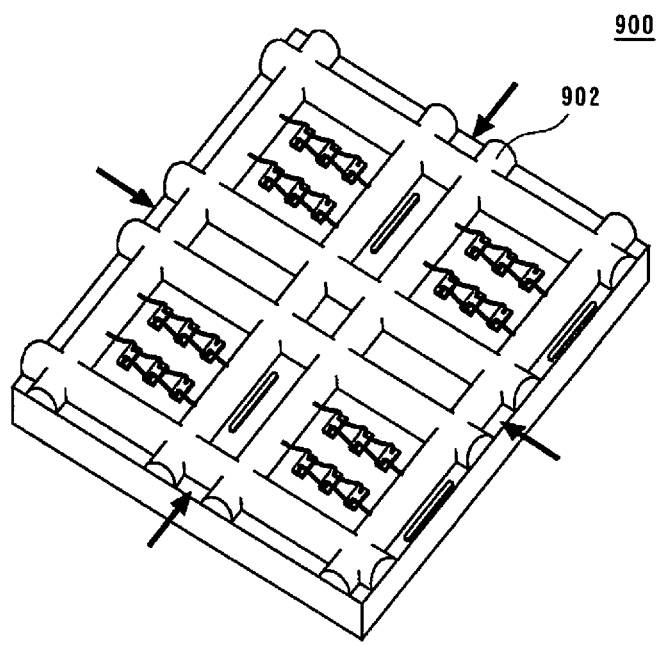
FIG. 9B is a view showing a part of light emitting device aggregation prior to dividing the substrate, illustrating a state after disposing a light reflecting resin to the state shown in FIG. 9A.

The dividing step will now be described below. FIG. 9A and FIG. 9B are views respectively showing a part of light emitting device aggregation prior to dividing the substrate, FIG. 9A illustrates a state before disposing a light reflecting resin and FIG. 9B illustrates a state after disposing the light reflecting resin 902. As shown in FIG. 9A, the conductor wirings 903A, 903B are disposed on the substrate 901 and the light emitting elements 904 are mounted thereon, and the light emitting elements and the conductor wirings are electrically connected by using the electrically conductive wires 905. Thereafter, as shown in FIG. 9B, the light reflecting resin 902 is disposed surrounding the light emitting elements 904. Here, the light reflecting resin 902 is disposed to intersect longitudinally and laterally, and the dividing positions are shown by arrows in the figure. With this arrangement, formation of the light reflecting resin can be facilitated and the dividing step can be carried out relatively easily. However, the shape or method is not limited thereto, and other methods such as print coating can be employed.

In addition, the outer shape (outer edge) of the light reflecting resin may correspond to the shape of the substrate.

Further, the outer edges of the substrate and the light reflecting resin (outer shapes) can be different. For example, as shown in FIG. 1A, the light reflecting resin 102 may includes a first region A which is spaced apart from the outer edge of the substrate 101 and a second region B which is in contact with (conformable to) the outer edge of the substrate.

Disposing only a part of the light reflecting resin spaced apart from the outer edge of the substrate, in other words, exposing a part of the substrate, allows a part of the dividing (cutting) position to be only the substrate, so that dividing (cutting) can be carried out with good productivity. As described above, in a case where the light reflecting resin is also cut at a part of the dividing position, the productivity will be somewhat lower than the case where only the substrate is divided, however, it will be advantageous that the adhesion area between the light reflecting resin and the substrate can be increased and further, the step of disposing the light reflecting resin can be simplified. In addition, as shown in FIG. 8, the intersecting portions of the longitudinally and laterally provided light reflecting resin can be formed rounded.

In addition, the first region of the light reflecting resin is preferably disposed to be interposed between the second regions at a side of the substrate. With this arrangement, the adhesion area between the light reflecting resin and the substrate can be increased. In addition, in a case where a lens member is disposed on the light reflecting resin, the adhesion with the lens member can also be improved.

Further, the second region of the light reflecting resin is preferably disposed spaced apart from the corners of the substrate. With this arrangement, the light reflecting resin can be prevented from detaching from the substrate. In addition, provision of a mark and the like at a corner of the substrate to indicate the dividing positions and prevent the mark from being covered by the light reflecting resin, dividing positional accuracy can be improved.

For the specific material of the light reflecting resin, a member which absorbs little or no light but effectively reflect the light from the light emitting elements is preferable. In a specific example, the reflectivity is preferably at least 50%, and more preferably 70% or higher. In a case where the light reflecting resin has a light scattering property, measurement of the reflectivity may be difficult, but in such a case, the reflectivity can be measured as a reference value by such a method in which a ratio proportional to the standard diffuser is determined by using an integrating sphere.

In addition, an insulating member is preferable, and a member resistant to deterioration by light from the light emitting elements and outside light is preferable. Also, a thermosetting resin, a thermoplastic resin, or the like, a resin having a certain degree of strength can be used. Specific examples thereof include a phenol resin, a glass epoxy resin, a BT resin, and a PPA resin. Addition of a reflecting member (for example, $TiO_2$, $Al_2O_3$, $ZrO_2$, or $MgO$) which reflects light from the light emitting elements to the resin parent body allows to reflect light effectively.

Such a light reflecting resin can be disposed easily by discharging a high viscosity resin from a nozzle of a predetermined size (width) after mounting the light emitting elements and the protective element to be described later, on the conductor wirings. In addition, the light reflecting resin can be disposed by using a method such as a print coating. The light reflecting resin disposed as described above can serve as a protective member protecting the light emitting elements or the like, after being hardened by heat, light, or the like.

Substrate

A substrate is a insulating member to which a conductor wiring is provided. An approximately tabular member capable of providing a light reflecting resin thereon and/or of mounting a light emitting element, protective element, or the like, thereon may be provided on the substrate. Examples of the substrate material include glass epoxy resin, ceramics, glass, and plastic. Particularly, as ceramics, alumina, aluminum nitride, mullite, silicon carbide, or silicon nitride is preferable. Examples of plastic include epoxy resin, polyimide resin or the like. A substrate having high heat resistance can be obtained by using such a material.

Conductor Wiring

Figure 2:
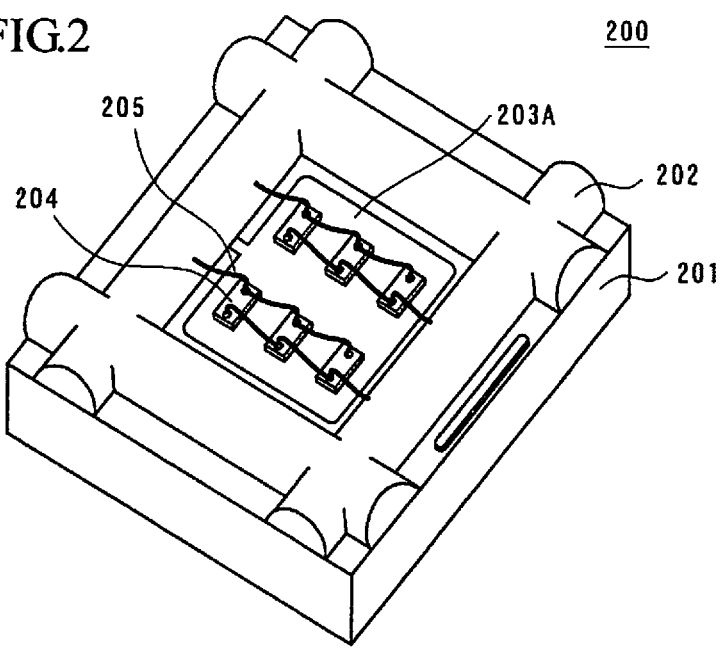
FIG. 2 is a perspective view illustrating an example of a light emitting device according to the present invention.

A conductor wiring is disposed on an upper surface of the substrate continuous to the back surface of the substrate through an inner portion or a surface of the substrate, and serves to establish an electric connection with outside. The size and shape of the conductor wiring can be selected variously, for example, as the light emitting device 100 shown in FIG. 1, the conductor wiring may be disposed widely so that an end portion thereof is buried in the light reflecting resin 102, or as the light emitting device 200 shown in FIG. 2, the conductor wiring 203A having a portion spaced apart from the light reflecting resin 202 may be disposed and on which the light emitting elements 204 are provided. The conductor wiring includes a material having no electrical connection with outside and serving a light reflecting member.

Figure 10A:
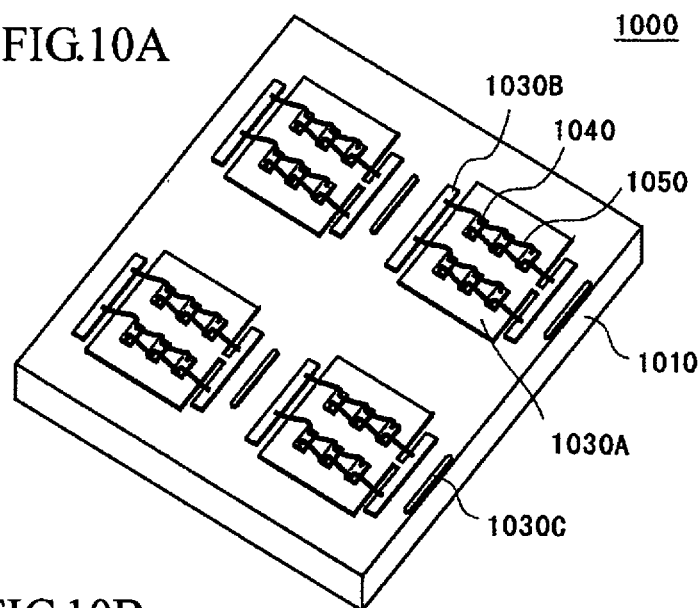
FIG. 10A is a perspective view illustrating a method of manufacturing a light emitting device according to the present invention.

These conductor wiring is to be disposed such that at least two conductor wiring serving as at least a pair of positive and negative electrodes, for example, the conductor wirings 103A, 103B as shown in FIG. 10A, are to be formed on the substrate which has been divided in the third step (dividing step) to be described later. The position, size, shape, or the like of the conductor wiring are appropriately adjusted according to the substrate, the number of the light emitting elements, or the like. In FIG. 10A, all of the light emitting elements 104 are mounted on the conductor wirings 103A, but it is not limited thereto, the light emitting elements 104 may be mounted on the conductor wirings 103A, 103B, respectively.

The conductive wiring 103C is made of the same material as the conductive wiring s 103A, 103B each of which serves as an electrode, but the conductive wiring 103C is provided as a mark (cathode mark/anode mark) for indicating the polarity of the light emitting device and is not for electrical connection. It is preferable that the conductor wirings 103C are also disposed at the positions such that each of which will be on each of the divided substrate. The size and shape thereof can be selected appropriately.

Specific examples thereof include metals such as copper, aluminum, gold, silver, tungsten, iron, and nickel, or iron-nickel alloy, phosphorus bronze, copper containing iron, or the like.

Sealing Member/Lens Member

A sealing member is a member provided in or outside of a region surrounded by the light reflecting resin, to protect the light emitting elements and the protective elements or the like, from dust, moisture, external force, or the like. In addition, the sealing member preferably has light transmissive property which allows light from the light emitting elements transmits therethrough, and resistance to such light. Specific examples thereof include a silicone resin, an epoxy resin, and a urea resin. In addition to above-described materials, a coloring agent, a light diffusing agent, a filler, a color conversion member (fluorescent member) or the like, can be included as needed.

The filling amount of the sealing member is needed to be sufficient to cover the semiconductor light emitting element, the protective element such as Zener diode, and a conductive wire, or the like.

The surface shape of the sealing member can be suitably selected according to the light distribution properties and the like. For example, as shown in FIG. 4B, the sealing member can be filled as the same as or lower the height of the light reflective resin 402. Here, the sealing member is formed in a concave shape in which the center portion is somewhat lower than the surrounding portion, but the shape is not limited thereto, a shape having a flat top surface or a convex shape in which the center portion is higher than the surrounding portion can be employed.

In addition to the sealing member, a lens member may also be disposed. For example, as the light emitting device 600 shown in FIG. 6, a lens member extending the outer edge of the substrate 601 and having a hemisphere shape can also be disposed. Here, the lens member 608 is provided such that the lens has a spherical shape part somewhat externally above the light reflecting resin 602.

The light from the light emitting elements 604 hardly reaches the external sides of the light reflecting resin 602, therefore, the lens shape is not needed. With such a shape, when the individual chips are formed (dividing) after disposing the lens member, the dividing can be carried out without damaging the lens portion (the spherical shape part). Therefore, adverse effect on the optical properties can be suppressed. In addition, as described above, when the lens member 608 is provided as a different member than the sealing member 606, for example, in a case where a wavelength converting member (a fluorescent member) is used as will be described below, the fluorescent member can be mixed only to the sealing member 606 and thus, the amount of the fluorescent member needed to obtain a desired emission color can be easily determined, and the lens portion can be formed using only a resin, so that adjustment of the light distribution properties can be facilitated. The curvature and size of the lens can be selected variously according to the desired light distribution properties.

Figure 6:
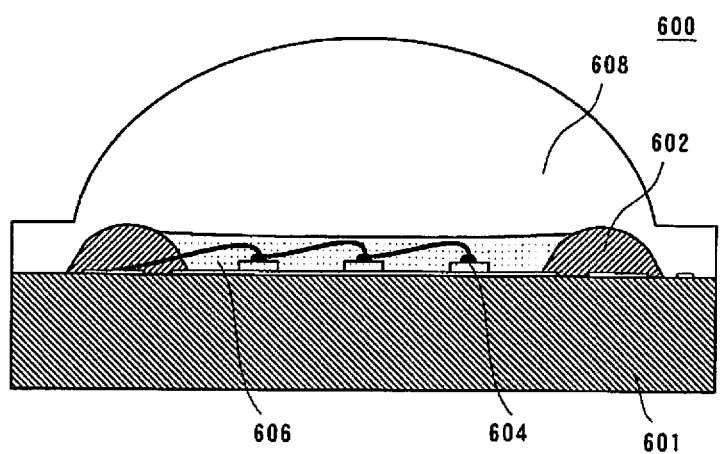
FIG. 6 is a sectional view illustrating an example of a light emitting device according to the present invention.

Moreover, the lens member can be formed not only in a hemispherical lens shape as shown in FIG. 6, but also in a shape with a recess portion capable of laterally reflecting light, a Fresnel lens shape, or the like. Forming the lens member in a hemispherical shape allows adjusting the directional characteristics. In addition, a diffusing agent, a pigment, a wavelength converting member, or the like, can be mixed depending on the purpose and intended use.

Die Bonding Resin

Die bonding member is a bonding member for mounting a semiconductor light emitting element, the protective element or the like on a base substrate or a conductive member. According to the substrate whereon the element is mounted, either a conductive die bonding member or an insulating die bonding member can be elected. For example, either insulating or conductive die bonding member can be used for a semiconductor light emitting element in which a nitride semiconductor layers are stacked on a sapphire substrate which is an insulating substrate. When a conductive substrate such as SiC substrate is used, conduction can be established by using a conductive die bonding member. Examples of the insulating die bonding member include an epoxy resin and a silicone resin. When the above described resins are used, a metal layer having high reflectivity such as an Al layer may be provided on the back surface of the semiconductor light emitting element, in consideration of deterioration due to light and heat from the semiconductor light emitting element. In this instance, a method such as vacuum evaporation, sputtering, or thin layer bonding can be employed. Examples of conductive die bonding members include a conductive paste comprising silver, gold, or palladium, a solder such as Au—Sn eutectic, and a brazing filler metal such as a low melting temperature metal. Moreover, among such die bonding members, especially when a transparent die bonding member is used, a fluorescent member which absorbs light from the semiconductor light emitting element and emits light in different wavelength can be included.

Electrically Conductive Wire

Examples of the electrically conductive wire which connect the electrodes of a light emitting element and the electrically conductive members include an electrically conductive wire made of a metal such as gold, copper, platinum, and aluminum, and an alloy thereof. Particularly, gold excellent in thermal resistivity or the like is preferably used.

Wavelength Converting Member

In the above described transparent member, a fluorescent member which absorbs at least part of light from the semiconductor light emitting element and emits light in different wavelength may be included as a wavelength converting member.

It is more efficient when a fluorescent member converts light from the semiconductor light emitting element to a light with longer wavelength. The fluorescent member may comprise a single layer made of a fluorescent material etc., may comprise a single layer made of mixture of two or more fluorescent materials etc., may comprise two or more stacked layers of single layers each of which made of a fluorescent material etc., or may comprise two or more stacked layers of single layers each of which is made of a mixture of two or more fluorescent materials etc.

The fluorescent member is needed to, for example, absorb light from a semiconductor light emitting element comprising a nitride semiconductor as a light emitting layer and converts it to light of a different wavelength. The fluorescent material is preferably at least one selected from among nitride fluorescent materials and oxynitride fluorescent material that is mainly activated with lanthanoid elements such as Eu and Ce; alkaline earth halogen apatite fluorescent material that is mainly activated with lanthanoid elements such as Eu and transition metal elements such as Mn; alkaline earth metal halogen-borate fluorescent material; alkaline earth metal aluminate fluorescent material; rare earth element aluminate fluorescent material that is mainly activated with alkaline earth silicate, alkaline earth sulfide, alkaline earth thiogallate, alkaline earth silicon nitride, germanate, or lanthanoid elements such as Ce; and organic and organic complexes that are mainly activated with rare earth silicate or lanthanoid elements such as Eu.

Example of the rare earth aluminate phosphor that is mainly activated by lanthanoid elements such as Ce include YAG based phosphor represented by the formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y, Gd)_3(Al, Ga)_5O_{12}$. It also includes $Tb_3Al_5O_{12}$:Ce and $Lu_3Al_5O_{12}$:Ce in which portion or all of Y is substituted with Tb or Lu.

It is possible to use a phosphor which is other than the phosphor described above and has the same performances and effects as those of the fluorescent materials.

(Semiconductor Light Emitting Element)

In the present invention, a light emitting diode is preferably used as a semiconductor light emitting element.

A semiconductor light emitting element having any output wavelength can be selected. For constructing blue and green light emitting elements, ZnSe and nitride semiconductor ($In_XAl_YGa_{1-X-Y}N$, $0≤X$, $0≤Y$, $X+Y≤1$) may be used. For constructing red light emitting elements, GaAs, InP, and the like may be used. Further, a semiconductor light emitting element made of materials other than those described above may also be used. Composition, emitting color, size, and number of the light emitting elements can be selected arbitrarily according to purpose.

Examples of such semiconductor light emitting elements comprise various semiconductors such as ZnSe and GaN. However, a nitride semiconductor ($In_XAl_YGa_{1-X-Y}N$, $0≤X$, $0.1≤Y$, $X+Y≤1$) capable of emitting light with a short-wavelength which sufficiently excites the fluorescent material is preferable. Various wavelengths of emission can be selected according to the materials and the mixed crystal ratio of the semiconductor layer.

In addition, a light emitting element capable of emitting light which is not only in visible light range but also ultraviolet light and infrared light can be formed. Further, along with a semiconductor light emitting element, an optical detector element or the like can be mounted.

Resin Discharge Device

The resin discharge device is used for disposing the light reflecting resin in the second step. For example, as shown in such as FIG. 10B, using the sir pressure, the device is capable of discharging liquid resin continuously or in a dot shape.

Manufacturing Method

The present invention provides a method of manufacturing a light emitting device including: a first step of mounting a light emitting element on a substrate having a conductor wiring and electrically connecting the light emitting element with the conductor wiring, a second step of disposing a light reflecting resin which reflects light from the light emitting element to surround the light emitting element, and a third step of disposing a sealing member after hardening the light reflecting resin to cover the light emitting element.

The manufacturing method may be further provided with at least one of followings;

a. the light reflecting resin is disposed by discharging a liquid resin from a resin discharge device;

b. the resin discharge device is moved while discharging the liquid resin over the substrate;

c. further comprising a fourth step of dividing the substrate after hardening the sealing member disposed in the third step, wherein the resin discharge device is moved over a dividing position of the substrate of the fourth step while discharging the liquid resin;

d. the resin discharge device is mover over a region spaced apart from the dividing position of the fourth step;

e. the resin discharge device is moved over the substrate in longitudinal direction and lateral direction to dispose a first light reflecting resin, then, the resin discharge device is moved over the first light reflecting resin to dispose a second light reflecting resin at least a part thereof being in contact with the first light reflecting resin;

f. a liquid resin is discharged while the resin discharge device is at rest and discharge of the resin is interrupted while the resin discharge device is moving;

g. the first light reflecting resin and the second light reflecting resin are disposed spaced apart from a dividing position of the fourth step and in contact with each other;

h. using a mask covering over the light emitting element and having an opening surrounding the light emitting element, the light reflecting resin is discharged from the opening to dispose the light reflecting resin;

i. in the first step, an electrically conductive wire is used for connection, and in the second step, at least a part of the electrically conductive wire is covered;

j. the first step includes a step of mounting a protective element and electrically connecting the conductor wiring and the protective element, and the second step includes a step of covering the protective element;

k. first light reflecting resin and the second light reflecting rein are disposed overlapping over the protective element.

Embodiment 1

A method of manufacturing a light emitting device according to the present invention will be described below.

Figure 11A:
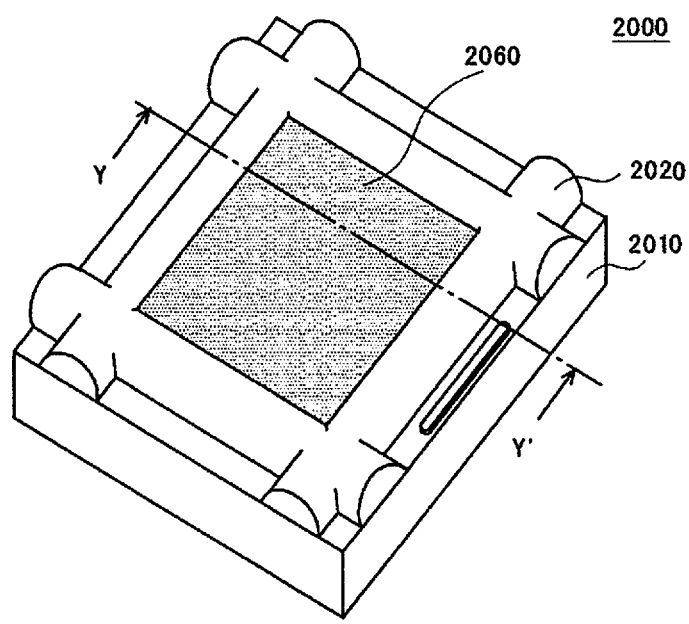
FIG. 11A is a perspective view illustrating an example of a light emitting device according to the present invention.
Figure 11B:
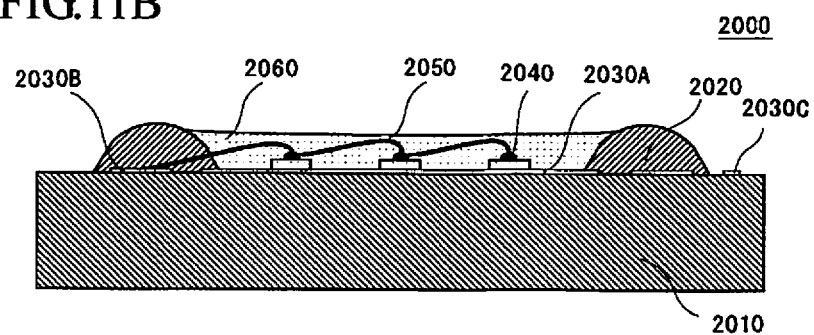
FIG. 11B is a sectional view of a light emitting device taken along line Y-Y' of FIG. 11A.
Figure 11C:
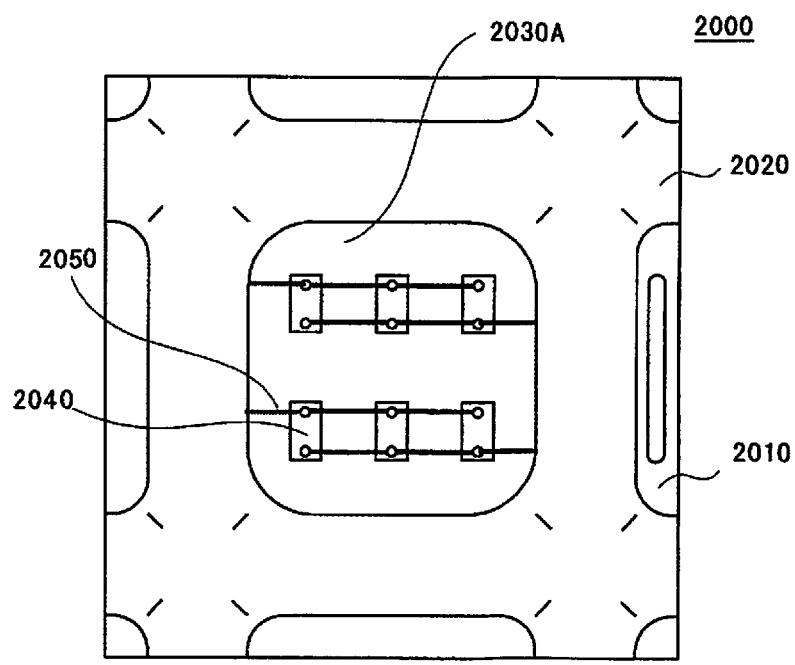
FIG. 11C is a top view of the light emitting device of FIG. 11A illustrating a sealing member in its transparent state.

A light emitting device 200 obtained according to the present method is shown in FIG. 11A to FIG. 11C. FIG. 11A is a perspective view of the light emitting device 200, FIG. 11B is a sectional view taken along line Y-Y' of FIG. 11A, and FIG. 11C is a top view of the sealing member 206 of FIG. 11A in its transparent state. As shown in FIG. 11C, the corners of the light reflecting resin 202 have a rounded shape, but the rounded shape is omitted in FIG. 11A for simplify.

In the present embodiment, a light emitting device 200 includes an approximately rectangular substrate 201 having conductor wiring 103A, 103B, and 103C provided on its top surface, and a plurality of light emitting elements 204 mounted on the conductor wiring 103A. The light emitting elements 204 are electrically connected with the conductor wiring s 203A, 203B through the electrically conductive wires 205.

Then, a light reflecting resin 202 which reflects light from the light emitting elements is disposed surrounding the light emitting elements 204. With this arrangement, light can be reflected efficiently and the light extraction efficiency can be improved. In addition, disposing such a light reflecting resin 202 to bury a part of the electrically conductive wires 205 allows minimizing the exposure of the electrically conductive wires and suppresses absorption of light. Thus, the optical output can be further improved.

In the present embodiment, the light reflecting resin 202 is disposed to the end portion of the substrate 201. With this arrangement, the light reflecting resin in a plurality of the light emitting devices produced from a single substrate can be disposed relatively easily and efficiently.

The light emitting devices as described above can be obtained through the steps as shown in FIG. 10A to FIG. 10E.

FIG. 10A to FIG. 10E are figures sequentially showing a method of manufacturing the light emitting devices to obtain the light emitting devices as shown in, such as FIG. 11A, and illustrating the steps which are carried out on the substrate 101 prior to dividing. Here, an aggregation of four light emitting devices is illustrated, but in practice, a substrate having a size capable of providing many more light emitting devices are used, and a part thereof is shown in the figures. In addition, the substrates of before and after the dividing will be referred to simply a substrate.

1-1. First Step

In the first step, the light emitting elements are mounted on a substrate having the conductor wirings, and the light emitting elements and the conductor wirings are electrically connected respectively. FIG. 10A shows the state in which the first step has been completed. As shown in FIG. 10A, in the aggregation 100 of the light emitting devices, the conductor wirings 103A, 103B, and 103C are disposed on the upper surface of the substrate 101. The shape, size, arrangement of the conductor wirings are not limited to that shown in FIG. 10A and can be selected appropriately.

Such a conductor wiring can be obtained, for example, in a case where a ceramic substrate is used, by applying an electrically conductive paste containing fine particles of a high melting point metal such as tungsten and molybdenum in a predetermined pattern in a step of unbaked ceramics green sheet, then, baking it. Further, after baking the ceramics green sheet, nickel, gold or silver may be plated on the conductor wirings which are previously disposed. In the present invention, the term "conductor wiring" includes the plated metal.

In a case where a ceramics substrate is used, as described above, other than to dispose the conductor wirings and the insulating portions integrally, the conductor wirings can be disposed on a ceramics plate that is baked previously.

In a case glass epoxy resin is used for the substrate, a copper plate is attached to an epoxy resin containing glass cloth or a partially hardened epoxy resin prepreg and then thermally harden it. After that, a desired pattern is formed in the copper plate by using photolithography to obtain the conductor wirings.

Using a die bonding member (bonding member), the light emitting elements 104 are mounted on the conductor wirings 103A having a large area among the conductor wirings shown in FIG. 10A formed as described above. Here, 6 pieces of rectangular light emitting elements are used and arranged in 3×2 lines, but the configuration is not limited thereto, the light emitting element of other shapes such as square can be used, and also with an appropriate arrangement.

The conductor wirings 103A, 103B and the light emitting elements 104 are electrically connected through the electrically conductive wires 105, respectively. The connection between the conductor wirings and the light emitting elements can be made either directly or indirectly, through the electrically conductive wires. Here, the light emitting elements 104 which are directly connected to the conductor wirings 103A and the conductor wirings 103B through the electrically conductive wires 105, respectively are mixed with the light emitting elements 104 and which are indirectly connected via the adjacent light emitting elements, but the connection is not limited thereto, a various ways of connection can be employed. In addition, without using an electrically conductive wire, the connection can be made by using an electrically conductive bonding member. The conductive wiring 103C is made of the same material as the conductive wirings 103A, 103B each of which serves as an electrode, but the conductive wiring 103C is provided as a mark (cathode mark/anode mark) for indicating the polarity of the light emitting device and is not for electrical connection.

In addition other than the light emitting elements, a protective element can be provided. The protective element is electrically connected to the conductor wiring by using an electrically conductive wire as in the light emitting elements. In this case, it is preferable to dispose a protective element at a position where the light reflecting resin to be disposed in a post-process. With this arrangement, absorption of light by the protective element can be reduced. Moreover, since a protective element is not provided between the light emitting elements and the light reflecting resin, a more uniform light distribution can be obtained. Further, the protective element is buried in the light reflecting resin, downsizing of the light emitting element can be achieved.

1-2. Second Step

In the second step, a light reflecting resin which reflects light from the light emitting elements is disposed to surround the light emitting elements.

1-2-1. Second Step (1)

Figure 10B:
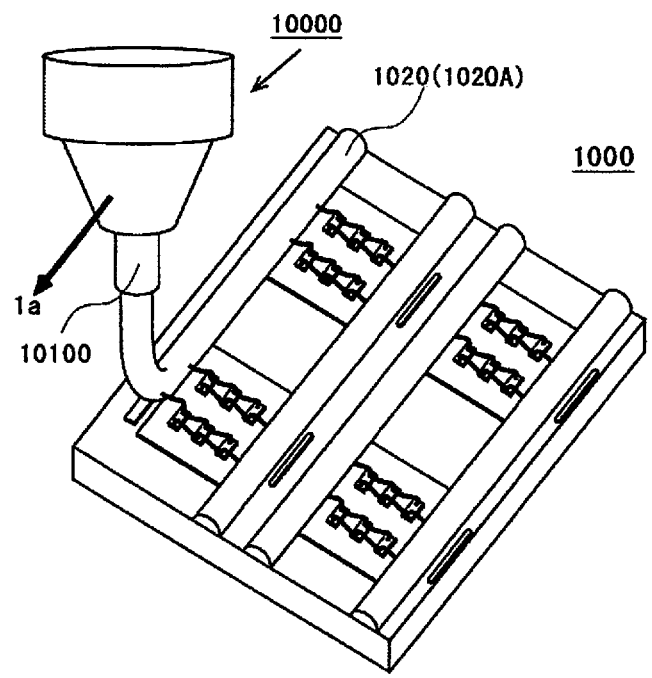
FIG. 10B is a perspective view illustrating a method of manufacturing a light emitting device according to the present invention.
Figure 10C:
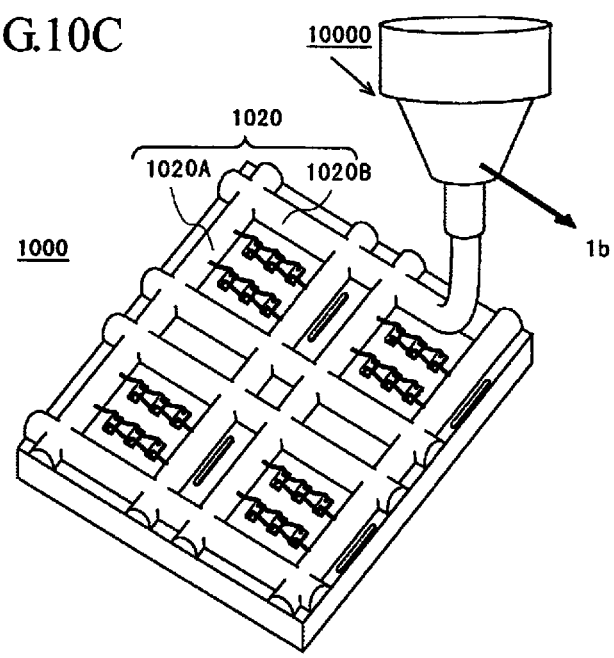
FIG. 10C is a perspective view illustrating a method of manufacturing a light emitting device according to the present invention.

FIG. 10B is a view illustrating a step of disposing the light reflecting resin 102 (102A) by using a resin discharge device 1000 on the substrate 101 whereon the light emitting elements obtained in the first step have been mounted. In the present embodiment, first, a first light reflecting resin 102A is disposed as shown in FIG. 10B, and next, a second light reflecting resin 102B is disposed as shown in FIG. 10C. Thus, the light reflecting resin 102 surrounding the light emitting elements is disposed in the two steps.

The resin discharge device 1000 is capable of moving (movable) in up-and-down direction or in lateral direction with respect to the substrate 101, above the fixed substrate 101. Typically, a syringe for storing a resin and a regulator for controlling the discharge pressure or the like are equipped to the main body (not shown) to which the resin discharge device 1000 as shown in FIG. 10B and the like is attached.

In the present specification, the nozzle 1010 for discharging the resin is shown in the figures as the resin discharge device 1000 and other parts are omitted. The steps below will be described mostly with reference to this part. In the figures, an example is illustrated with a single resin discharge device, but it is not limited thereto, a plurality of the devices can be attached to the main body. With this arrangement, a plurality of lines of the light reflecting resin can be disposed at the same time.

Figure 16A:
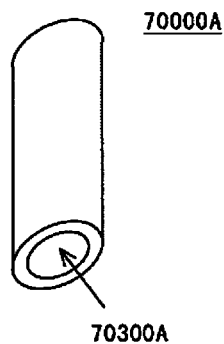
FIG. 16A is a perspective view showing a nozzle of a resin discharging apparatus.
Figure 16B:
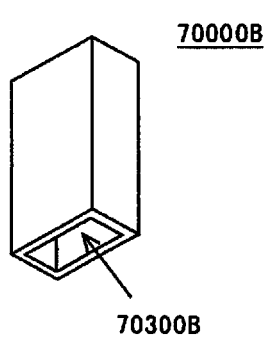
FIG. 16B is a perspective view showing a nozzle of a resin discharging apparatus.
Figure 16C:
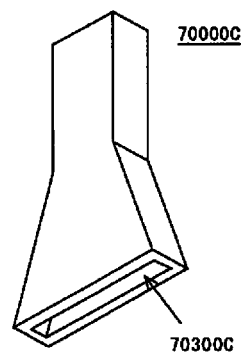
FIG. 16C is a perspective view showing a nozzle of a resin discharging apparatus.

FIG. 16A to FIG. 16C are figures showing the shape of the nozzle. The outer shape of the nozzle may be such as a cylindrical tube as shown in FIG. 16A, quadrangular tube as shown in FIG. 7B, or a tube with a tapered end. In addition, the shape of the opening can also be variously selected. For example, a circular opening 7030A as shown in FIG. 16A, a quadrangular opening 7030B as shown in FIG. 16B, and a rectangular opening 7030C as shown in FIG. 16C or the like, can be employed.

In the present embodiment, firstly as shown in FIG. 10B, the resin discharge device 1000 is moved while discharging a liquid resin from the nozzle 1010 at its tip to dispose the light reflecting resin 102 in the vicinity of the light emitting devices 104.

In this embodiment, the resin discharge device 1000 is moved in one direction (longitudinal direction or lateral direction), for example, in the direction indicated by an arrow 1a in the figure. At this time, the resin discharge device 1000 for covering a part of the electrically conductive wires 105 with the light reflecting resin 102 is moved above and in the vicinity of the light emitting elements 104. With this arrangement, a linear first light reflecting resin 102A can be disposed in the vicinity of the light emitting elements 104.

All of the moving directions of the resin discharge device 1000 can be the same, for example in a direction indicated by arrow 1a in FIG. 10B. That is, a plurality of the light reflecting resins 102A are disposed in parallel to each other, and all of them can be disposed by moving the resin discharge device 1000 in the direction indicated by arrow A. Alternatively, after moving in the direction of arrow A, when the adjacent light reflecting resin 102A is to be disposed, the resin discharge device 1000 may be moved in the opposite direction.

1-2-2. Second Step (2)

Next, as shown in FIG. 10C, the resin discharge device 1000 is moved in the direction indicated by arrow 1b in the figure, that is, in a direction intersecting the first light reflecting resin 102A which is previously disposed, to dispose the second light reflecting resin 102B so as to surrounding the light emitting elements 104. At this time, the resin discharge device 1000 may be moved above the substrate 101, the conductor wirings 103A, 103B, and further, above the light reflecting resin 102A disposed previously, while discharging the liquid resin. Alternatively, discharging of the resin may be interrupted above the light reflecting resin 102A.

Figure 10D:
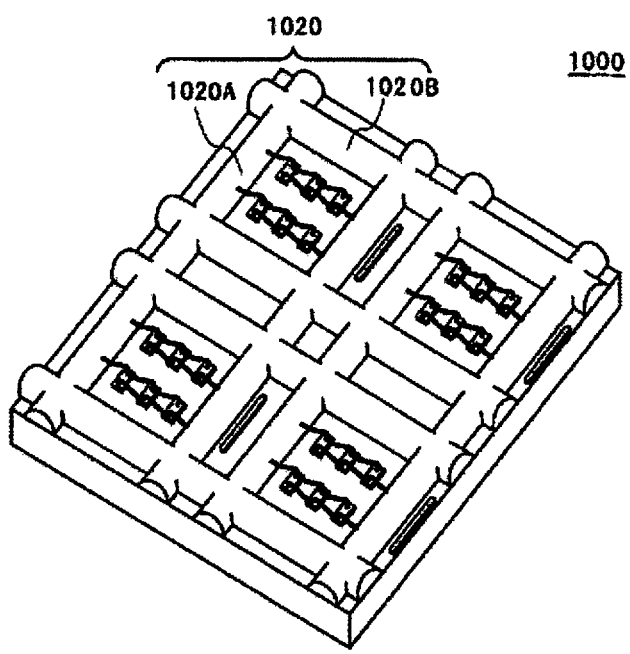
FIG. 10D is a perspective view illustrating a method of manufacturing a light emitting device according to the present invention.

As described above, first, the resin discharge device is moved in a direction along the substrate to dispose the light reflecting resin, and then, the resin discharge device is moved in a direction approximately orthogonal to the previously disposed light reflecting resin to dispose the light reflecting resin. That is, the step of disposing the light reflecting resin is carried out in two or more steps. With this arrangement, the aggregate of the light emitting devices 100 as shown in FIG. 10D can be obtained.

The moving speed of the resin discharge device 1000 can be appropriately adjusted according to the viscosity, temperature, or the like, of the resin. In order to dispose a plurality of light reflecting resins of approximately the same width, it is preferable to move the device at a constant speed at least while discharging the resin. In a case where the discharge of the resin is interrupted while the device is in motion, the moving speed in the interval can be changed.

The discharge rate of the resin is also preferably constant. Further, both the moving speed of the resin discharge device and the discharge rate of the resin are preferably constant. Adjustment of the discharge rate can be achieved by maintaining the pressure applied at discharging or the like constant In FIG. 10B, the resin discharge device 1000 moves above the locations along which the substrate is to be divided in a post-process, while discharging the liquid resin. In a case where a number of the light emitting devices are produced by using the same substrate, moving the resin discharge device while continuously discharging a liquid resin as described above, the light reflecting resin can be easily formed with a uniform shape. Discharge can be interrupted to avoid the dividing locations, which will be described below.

The light reflecting resin 102 can be provided on the conductor wirings 103A, 103B or on the substrate 101, or on the both, at a portion surrounding the light emitting elements 104. For example, in FIG. 10B, the light reflecting resin 102 is disposed so as to cover a part of the conductor wiring 103A and the entire conductor wiring 103B. With this arrangement, the substrate 101 exposed between the conductor wiring 103A and the conductor wiring 103B can also be covered. Thus, in a case where a member made of glass epoxy resin or ceramic and capable of transmitting light relatively easily is used as a material of the substrate 101, light can be prevented from leaking out from the exposed portion, so that a reduction in the light extraction efficiency of the light emitting device can be suppressed.

Moreover, the light reflecting resin can be disposed so as also to bury a part of the electrically conductive wires. For example, as shown in FIG. 10B, by moving the resin discharge device 1000 pass through above the connection between the conductor wiring 103B and the electrically conductive wire 105, a part of the electrically conductive wire 105 can be buried in the light reflecting resin 102. With this arrangement, absorption of light by the electrically conductive wires can be reduced. For example, in a case where a light emitting element made of a nitride-based semiconductor and emits blue light is used and a gold wire is used as the electrically conductive wire, the blue emission is absorbed by the gold wire. As in the present invention, by covering even a part of the electrically conductive wire with a light reflecting resin, loss of light can be reduced and the light extraction efficiency of the light emitting device can be improved.

Further, in a case where a protective element is used, the first light reflecting resin and the second light reflecting resin are preferably disposed overlapping over the protective element. With this arrangement, the protective element can be covered easily.

1-3. Third Step

Figure 10E:
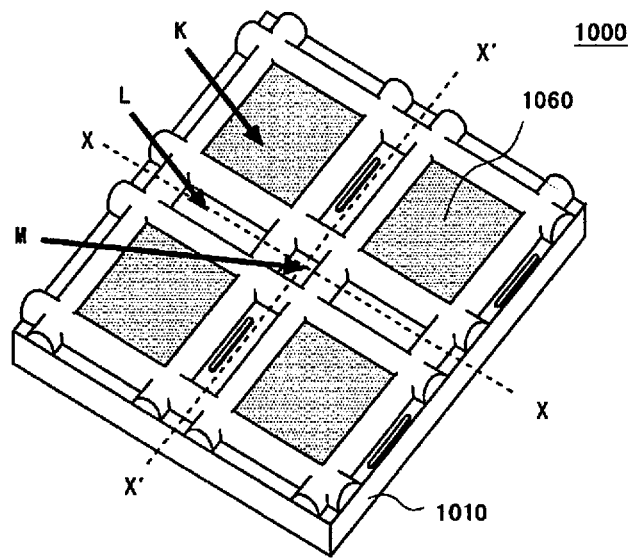
FIG. 10E is a perspective view illustrating a method of manufacturing a light emitting device according to the present invention.

In the third step, after the light reflecting resin is hardened in the second step, a sealing member is disposed to cover the light emitting elements. FIG. 10E is a figure showing an aggregate 100 of the light emitting devices in which a sealing member 106 is disposed on the aggregate 100 of the light emitting devices obtained in FIG. 10D. In this figure, the sealing member 106 is disposed so as to fill the inner side of the light reflecting resin 102 which is disposed in a frame-shape surrounding the light emitting elements 104. With this arrangement, the light emitting elements 104 can be protected from dust, moisture, external force or the like. In FIG. 10E, the sealing member 106 is disposed to fill the region K surrounded by the light reflecting resin 102. In addition to this, the sealing member 106 can be disposed in the region L and the region M where a light emitting element is not mounted.

In the third step, a liquid resin different than the light reflecting resin is used. A method appropriate to meet the need, such as a method of disposing the sealing member to fill the region surrounded with the light reflecting resin by using the resin discharge device 1000 as shown in, such as FIG. 10A (potting molding), a method of filling a light transmissive resin in a mold with a desired shape (compression molding, transfer molding), a method of disposing the resin by using a mask (print molding), and spray coating, can be used.

1-4. Fourth Step

In the fourth step, after hardening the sealing member disposed in the third step, the substrate is divided to obtain individual light emitting devices.

It is preferable to set the dividing positions to avoid the light reflecting resin surrounding the light emitting elements, as indicated by lines X-X' and X'-X' in FIG. 10E. That is, the regions L and the regions M are divided so that the regions K, where the sealing member 106 is provided, are intact and remain as the light emitting devices. At this time, a dividing method in two steps can be used, in which firstly only the light reflecting resin 102 on the substrate 101 is divided and secondly the substrate 101 is divided. For example, in a case where the dividing is carried out by using a cutting blade, the light reflecting resin 102 is cut to a depth approximately reaches the upper surface of the substrate 101, or to a depth slightly cut into the upper surface of the substrate 101, and then, the substrate 101 remaining at the same location is cut. As described above, by carrying out a step in parts according to the member to be cut, stress created at the time of cutting can be reduced and dividing can be carried out with good accuracy. However, it is not limited thereto, the light reflecting resin and the substrate can be cut in a single step.

For the dividing, various methods such as dicing, laser irradiation, or the like, can be selected.

In the light emitting devices obtained as described above, as shown in FIG. 11C, the light reflecting resin 202 is disposed in the vicinity of the light emitting elements 204, and particularly, is disposed so close that the connecting portions between the electrically conductive wires 205 and the conductor wirings are buried. Therefore, the loss of light from the light emitting elements 204 can be reduced.

Embodiment 2

Figure 12:
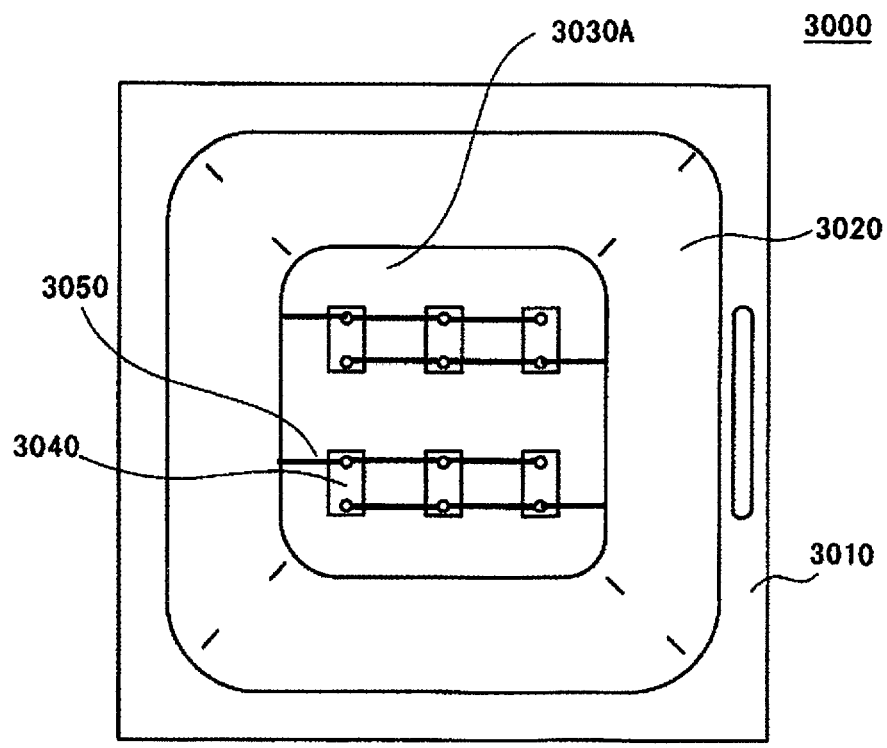
FIG. 12 is a top view illustrating an example of a light emitting device according to the present invention.

A light emitting device 300 obtained in Embodiment 2 is shown in FIG. 12. FIG. 12 is a top view of the light emitting device 300.

Figure 13A:
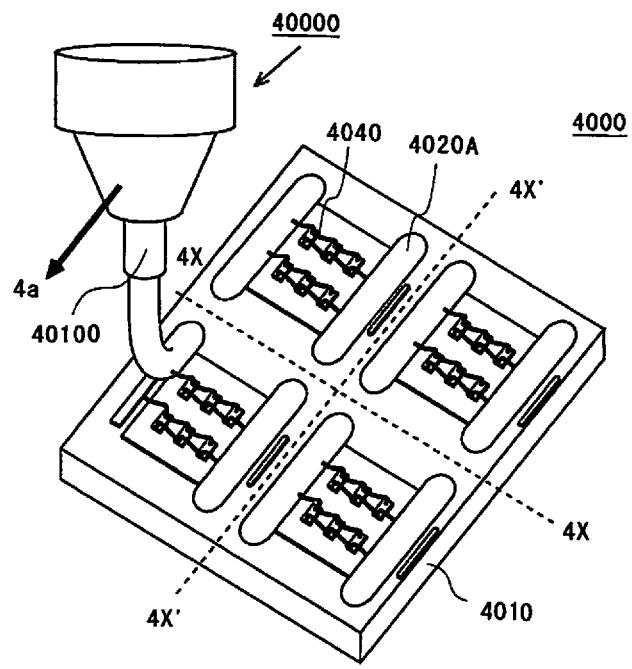
FIG. 13A is a perspective view illustrating a method of manufacturing a light emitting device according to the present invention.
Figure 13B:
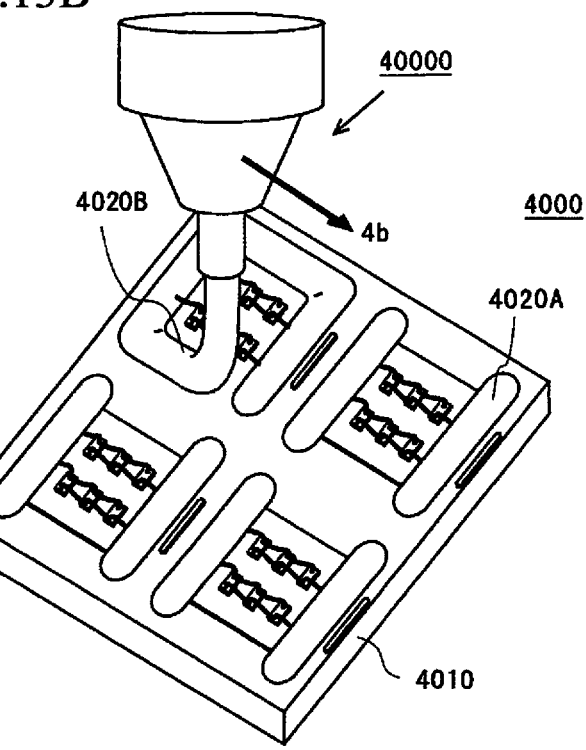
FIG. 13B is a perspective view illustrating a method of manufacturing a light emitting device according to the present invention.

FIG. 13A and FIG. 13B are figures illustrating a second step for disposing a light reflecting resin in a method of manufacturing a light emitting device to obtain a light emitting device 300 shown in FIG. 12.

The steps other than the second step can be similar to that of Embodiment 1, and therefore omitted.

2-2. Second Step

In the second step, a light reflecting resin which reflects light from the light emitting elements is disposed to surround the light emitting elements. In Embodiment 2, the light reflecting resin is not disposed at the dividing positions in the light emitting device 300, which is different from Embodiment 1. The same resin discharge device as in Embodiment 1 is used.

2-2-1. Second Step

FIG. 13A is a view illustrating a step of disposing the light reflecting resin 402 (402A) by using a resin discharge device 4000 on the substrate 401 whereon the light emitting elements obtained in the first step have been mounted. The light reflecting resin 402 can be disposed surrounding the light emitting elements by both the step shown in FIG. 13A and the following step shown in FIG. 13B.

Firstly, as shown in FIG. 13A, the resin discharge device 4000 is moved in the direction indicated by arrow 4a while discharging a liquid resin from the nozzle 4010 at its tip to dispose the first light reflecting resin 402A in the vicinity of the light emitting devices 404. At this time, the disposition is carried out avoiding the dividing positions (line 4X-4X', line 4X'-4x' in the figure). Such a deposition can be obtained by repeating discharge and interrupt of the resin from the resin discharge device 4000.

Next, as shown in FIG. 13B, the resin discharge device 4000 is moved in the direction indicated by arrow 4b in the figure, that is, in a direction intersecting the first light reflecting resin 402A which is previously disposed, to dispose the second light reflecting resin 402B so as to surrounding the light emitting elements 404. Here, the light reflecting resin is also disposed avoiding the dividing positions.

2-2-2. Different Method of Second Step 1

Figure 14:
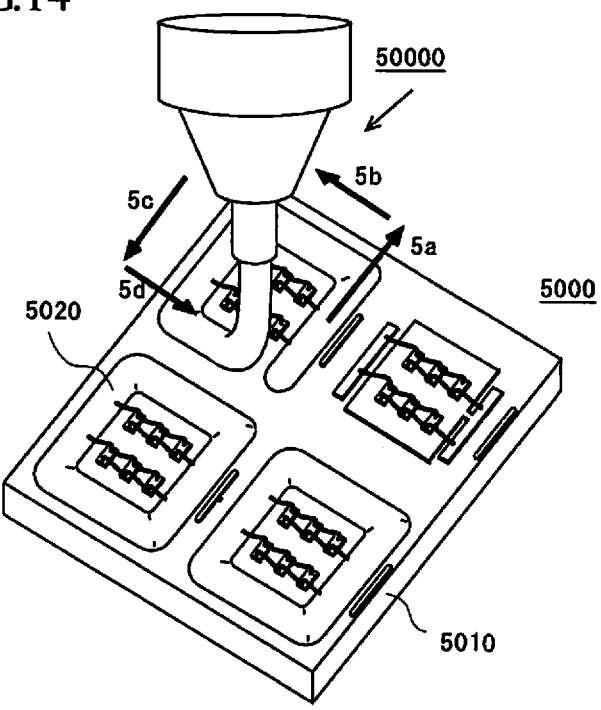
FIG. 14 is a perspective view illustrating a method of manufacturing a light emitting device according to the present invention.

FIG. 14 is a figure illustrating a different method of second step.

Here, as shown in FIG. 14, the resin discharge device 5000 is moved above the substrate 501 while discharging the resin sequentially in the directions indicated by arrows 5a, 5b, 5c, and 5d in the figure. The resin discharge device 5000 is moved in the direction of arrow 5d and after the resin is discharged so as to contact the initial point of the light reflecting resin 502 indicated by arrow 5a, discharging of the resin is interrupted. With this, the light reflecting resin surrounding the light emitting devices can be formed continuously. In addition, in FIG. 14, the light reflecting resin is disposed as an approximately square frame, but it is not limited to such a shape, and various shapes such as a circular shape, an oval shape, a polygonal shape can be employed.

2-2-32. Different Method of Second Step 2

Figure 15:
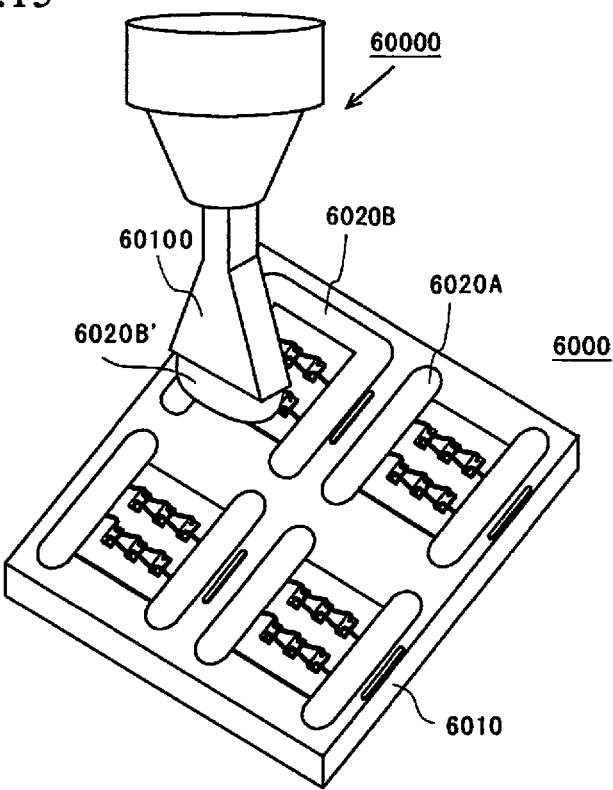
FIG. 15 is a perspective view illustrating a method of manufacturing a light emitting device according to the present invention.

FIG. 15 is a figure illustrating a different method of second step.

As shown in FIG. 15, in the present method 2, the nozzle 6010 provided to the resin discharge device 6000 has a wider discharge opening than the nozzles used in the above-described embodiments. Moreover, the liquid resin 602B' is discharged while the resin discharge device 6000 is at rest. That is, the resin discharge device 6000 capable of moving above the substrate 601 interrupts discharging in motion, and after reaching a predetermined position, it rests to discharge the resin.

In FIG. 15, a nozzle having laterally longer opening is used and the first light reflecting resin 602A and the second light reflecting resin 602B are disposed to form an approximately square frame, but the opening of the nozzle may have approximately square shape, or an L-shape, a doughnut-shape, or the like.

2-2-4. Different Method of Second Step 3

Figure 17A:
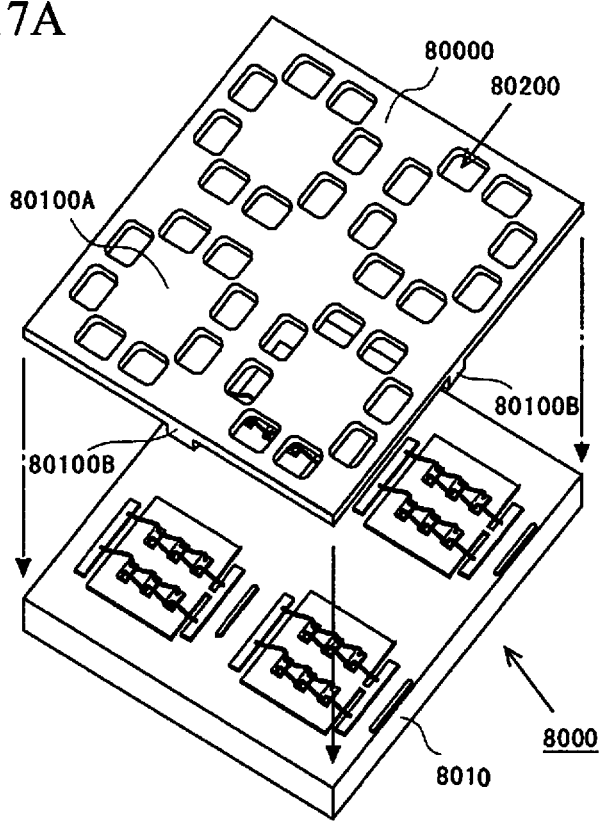
FIG. 17A is a perspective view illustrating a method of manufacturing a light emitting device according to the present invention.
Figure 17B:
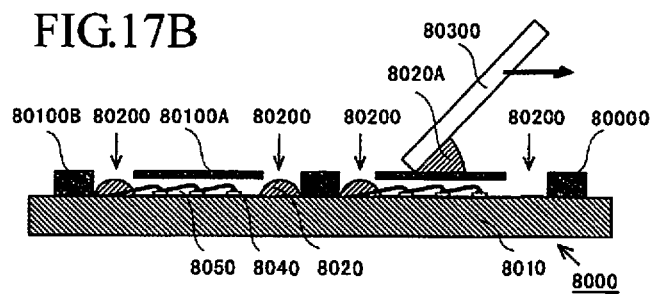
FIG. 17B is a sectional view illustrating a method of manufacturing a light emitting device according to the present invention.

FIG. 17A is a figure illustrating a method of disposing a light reflecting resin by using a mask 8000 having openings, instead of using the resin discharge device. FIG. 17B is a sectional view showing the mask 8000 of FIG. 17A being arranged on the substrate 801, and illustrating a state in which a squeegee is moving to injectingly supplying a high viscosity resin 802A through the openings 8020 (so-called printing method).

As shown in FIG. 17A, an approximately square mask 8000 having openings 8020 at positions corresponding to the light reflecting resin is placed over the aggregate 800 of the light emitting devices in which the light emitting elements are mounted on the conductor wirings on the substrate 801.

The mask 8000 has a plurality of openings 8020, and the shape, the number, the arrangement, and the like are appropriately adjusted according to the viscosity or the like of the resin. In addition, protrusions 8010B are provided so that the light emitting elements 804 and the electrically conductive wires 805 which are mounted on the substrate prior to mounting the mask are prevented from being damaged by the mask. The protrusions 8010B are preferably provided at positions corresponding to the dividing positions in a post-process. In addition, thin plates 8010A having a thickness smaller than the protrusions 8010B are provided so that the light reflecting resin is not injected on the light emitting elements 804.

By using such a mask 8000 and injecting a high viscosity resin from the openings, the light reflecting resin 8020 surrounding the light emitting elements 804 can be disposed.

It is sufficient that the mask has a plate-like shape and openings can be provided at desired positions, and is preferable that the mask is made of a material resistant to deformation. As such a material, a metal such as Ni or SUS, a hard resin, or the like can be used. Moreover, it is preferable that the mask has approximately the same area as that of the substrate with which using a device capable of fixing the substrate with a jig such as a screw, the light emitting devices can be manufactured with good location accuracy.

In addition, the squeegee for injecting the light reflecting resin into the openings of the mask is preferably made by using a material such as a rigid urethane and a metal, and is sufficient to have an excellent strength for printing, and the shape of the squeegee is preferably a plate-like shape, a sword-like shape, or a bar shape.

Embodiment 3

FIG. 6 is a sectional view of the light emitting device 600 obtained by, after disposing the sealing member in the third step, further, the lens member is disposed, then divided in the fourth step.

The substrate 101 to which the sealing member is disposed, for example as shown in FIG. 10E, is mounted in a metal mold capable of forming the lens portion 608 as shown in FIG. 6. A liquid resin is injected in the metal mold and hardened, then divided as a fourth step to obtain the light emitting device 600 having a lens portion.

EXAMPLE 1

As shown in FIG. 9A, a substrate which includes an alumina ceramics having a plate-like shape and the conductor wirings with their surface Ag-plated disposed thereon is prepared. Six pieces of the light emitting elements made of a nitride-based semiconductor each having sides of 500 μm and 290 μm are bonded on the conductor wirings by using a eutectic bonding member made of AuSn. The light emitting elements used in the present example produce blue emission light with the main wavelength of about 450 nm, and all six of them have approximately the same wavelength.

Next, a white resin (light reflecting resin) made of a silicone resin with titania ($TiO_2$) having an average diameter of 0.25 μm dispersed therein at a weight ratio of 50 wt %, is applied to surround the six light emitting elements.

In this way, an aggregate of the light emitting elements with the light reflecting resin disposed thereon, as shown in FIG. 9B, is formed. At this time, the line width (portions at which the longitudinal and lateral light reflecting resins are not intersect each other) of each light reflecting resin is approximately 600 μm at the bottom (the widest dimension in top view) in contact with the substrate. The light reflecting resin is disposed so that the exposed portions (exposed regions) of the alumina ceramics substrate between the conductor wirings on which the light emitting elements are mounted and the conductor wirings to which the gold wires are directly connected are covered, and the substrate is not disposed between the light emitting elements and the light reflecting resin. At this time, the light reflecting resin is disposed so as also to bury a part of the electrically conductive wires therein.

After the light reflecting resin is heat hardened, a sealing member comprising a different silicone resin with a YAG phosphor having an average diameter of 6 μm dispersed therein at a weight ratio of 50 wt % is dropwisely applied on the light emitting elements surrounded by the white light reflecting resin to seal them.

After the sealing member is hardened, the surface side of the sealing member is further covered by a silicone resin having a lens shape. Thereafter, the locations indicated by arrows in FIG. 9B are dividing by way of dicing to obtain the light emitting devices with the substrate having a size of □3.5 mm according to the present invention.

For comparison, a light emitting device is formed as in Example 1, except that instead of the light reflecting resin, a light transmissive resin in which titania is not dispersed therein is used. The measurement results of electro-optical properties are shown below.

TABLE 1

|  | Electric current | Chromaticity | Total luminous flux |
|---|---|---|---|
| Example 1 | 350 mA | x = 0.329<br>y = 0.332 | 117.7 lm |
| Comparative example | 350 mA | X = 0.326<br>Y = 0.337 | 108.8 lm |

As described above, in Example 1, the electrically conductive wires and the exposed portions of the substrate are buried in the light reflecting resin, so that the total luminous flux is about 8% higher than that of the comparative example in which a light transmissive resin is used.

EXAMPLE 2

A light emitting device according to the present invention is obtained in a same manner as in Example 1, except that after mounting the light emitting elements 904 on the conductor wiring 903A as shown in FIG. 9A, a protective element made of Si (silicon) having sides of 240 μm is mounted on the conductor wiring 903B by using an Ag paste, and the light reflecting resin 902 as shown in FIG. 9B is disposed to bury the protective element. In Example 2, the conductor wiring 903B is disposed somewhat longer (larger) to mount the protective element.

EXAMPLE 3

A single light emitting element, in which a substrate provided with gold-plated conductor wirings is used and which is made of a nitride-based semiconductor with the sides of 1 mm, is bonded on a black color aluminum nitrate plate by AuSn eutectic. At this time, the electrodes of the light emitting elements are arranged to face the conductor wiring side, and bonded without using the electrically conductive wires. The light emitting elements used here have emission wavelength in a blue region as in Example 1.

Next, a protective element having sides of 240 μm is bonded on the conductor wiring by Ag paste and electrically connected to the conductor wiring of each electrode with the electrically conductive wires made of gold.

Next, a white resin (light reflecting resin) made of a low viscosity silicone resin with titania having an average diameter of 0.25 μm dispersed therein at a weight ratio of 20 wt %, is applied to surround the light emitting elements by using a dispenser.

At this time, the light reflecting resin is disposed on all the substrate except the mounting surface of the light emitting elements and on all the conductor wirings. Accordingly, only the surface above the light emitting elements is exposed.

With this arrangement, light emitted from the light emitting elements can be extracted from the upper surface without entering the black substrate.

As described above, according to an embodiment of the present invention, a light emitting device capable of effectively reflecting light from the light emitting element and in which the light extraction efficiency is improved can be obtained.

In a case where an electrically conductive wire is used, absorption of light by the electrically conductive wire can be suppressed.

Moreover, according to another embodiment of the present embodiment, absorption and transmission loss of light caused by the substrate exposed from the conductor wiring can be suppressed, and the light extraction efficiency can be improved.

Further, in a case where a protective element is used, the absorption of light by the protective element can be suppressed.

Moreover, according to still another embodiment of the present invention, the members which absorb light or transmit light from the light emitting elements are buried in the light reflecting resin so that the light extraction efficiency can be improved.

In the light emitting device according to the present invention, the absorption of light is reduced and high power output can be achieved, so that it is applicable to various indicators, a lighting apparatus, a display, a backlight of liquid crystal display, and further to an image scanner device for a facsimile, a copier, a scanner etc., and a projector or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a substrate;
a light emitting element mounted on the substrate;
a light reflecting resin member surrounding the light emitting element, and configured and arranged to reflect light emitted from the light emitting element;
a sealing member disposed in a region surrounded by the light reflecting, resin member;
an electrically conductive wiring arranged on an upper surface of the substrate such that the substrate includes an exposed region exposed from the electrically conductive wiring with at least a part of the exposed region of the substrate being embedded in the light reflecting resin member, the electrically conductive wiring being electrically connected to the light emitting element; and
a lens member disposed above the light emitting element to reach an outer edge of the substrate, the lens member being in contact with an upper surface of the sealing member and an upper surface and an outer lateral surface of the light reflecting resin member, an entire top surface of the lens member being exposed with the top surface of the lens member defining a part of an outermost surface of the light emitting device.

2. The light emitting device according to claim 1, wherein the sealing member includes a color conversion member.

3. The light emitting device according to claim 1, further comprising a protective element electrically connected to the electrically conductive wiring, at least a part of the protective element being embedded in the light reflecting resin member.

4. The light emitting device according to claim 1, wherein the light reflecting resin member includes a first region spaced apart from the outer edge of the substrate and a second region in contact with the outer edge of the substrate.

5. The light emitting device according to claim 4, wherein the first region of the light reflecting resin member is disposed between the second region and an additional second region at a side of the substrate.

6. The light emitting device according to claim 4, wherein the second region is spaced apart from a corner of the substrate.

7. The light emitting device according to claim 1, wherein at least a part of the light emitting element is in contact with the light reflecting resin member.

8. The light emitting device according to claim 1, wherein the lens member is further in contact with an upper surface of the substrate.

9. A light emitting device comprising:
a substrate;
a light emitting element mounted on the substrate;
a light reflecting resin member surrounding the light emitting element, and configured and arranged to reflect light emitted from the light emitting element;
a sealing member disposed in a region surrounded by the light reflecting resin member;
an electrically conductive wiring arranged on an upper surface of the substrate, and electrically connected to the light emitting element;
a protective element arranged on the electrically conductive wiring such that the protective element is completely embedded in the light reflecting resin member; and
a lens member disposed above, the light emitting element to reach an outer edge of the substrate, the lens member being in contact with an upper surface of the sealing member and an upper surface and an outer lateral surface of the light reflecting resin member.

10. The light emitting device according to claim 9, wherein
the sealing member includes a color conversion member.

11. The light emitting device according to claim 9, wherein
the substrate includes an exposed region exposed from the electrically conductive wiring with at least a pan of the exposed region of the substrate being embedded in the light reflecting resin member.

12. The light emitting device according to claim 9, wherein
the light reflecting resin member includes a first region spaced apart from an outer edge of the substrate and a second region in contact with the outer edge of the substrate.

13. The light emitting device according to claim 12, wherein
the first region of the light reflecting resin member is disposed between the second region and an additional second region at a side of the substrate.

14. The light emitting device according to claim 12, wherein
the second region is spaced apart from a corner of the substrate.

15. The light emitting device according to claim 9, wherein
at least a part of the light emitting element is in contact with the light reflecting resin member.

16. The light emitting device according to claim 9, wherein
the lens member is further in contact with an upper surface of the substrate.

* * * * *